(12) United States Patent
Yuuki et al.

(10) Patent No.: US 7,714,985 B2
(45) Date of Patent: May 11, 2010

(54) PROJECTION OPTICAL SYSTEM

(75) Inventors: Hiroyuki Yuuki, Utsunomiya (JP); Takashi Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 528 days.

(21) Appl. No.: 11/751,139

(22) Filed: May 21, 2007

(65) Prior Publication Data

US 2007/0297047 A1 Dec. 27, 2007

(30) Foreign Application Priority Data

Jun. 21, 2006 (JP) .............................. 2006-171505

(51) Int. Cl.
*G03B 27/54* (2006.01)
*G03B 27/72* (2006.01)
*G03B 27/42* (2006.01)

(52) U.S. Cl. .............................. 355/67; 355/71; 355/53

(58) Field of Classification Search .................... 355/71, 355/67, 53
See application file for complete search history.

(56) References Cited

U.S. PATENT DOCUMENTS

| 5,323,263 | A  | 6/1994 | Schoenmakers |
| 6,600,608 | B1 | 7/2003 | Shafer |
| 7,092,168 | B2 | 8/2006 | Terasawa et al. |
| 2002/0024741 | A1 | 2/2002 | Terasawa |
| 2006/0176461 | A1 | 8/2006 | Sekine |

FOREIGN PATENT DOCUMENTS

| JP | 2001-228401 A | 8/2001 |
| JP | 2006-222222 A | 8/2006 |
| WO | 2005-069055 A3 | 7/2005 |

*Primary Examiner*—Peter B Kim
(74) *Attorney, Agent, or Firm*—Canon U.S.A., Inc., IP Division

(57) ABSTRACT

At least one exemplary embodiment is directed to a projection optical system that projects an image of a pattern of a first object onto a second object includes a first image forming optical system, a second image forming optical system, and a light-shielding member. The first image forming optical system forms an intermediate image of the pattern, and includes a concave mirror and a reflecting mirror. The concave mirror has a reflecting surface opposing the second object. The reflecting mirror directs light from the first object to the concave mirror. The second image forming optical system forms an image of the intermediate image onto the second object, and includes a lens. The light-shielding member is disposed between the concave mirror and the lens.

11 Claims, 18 Drawing Sheets

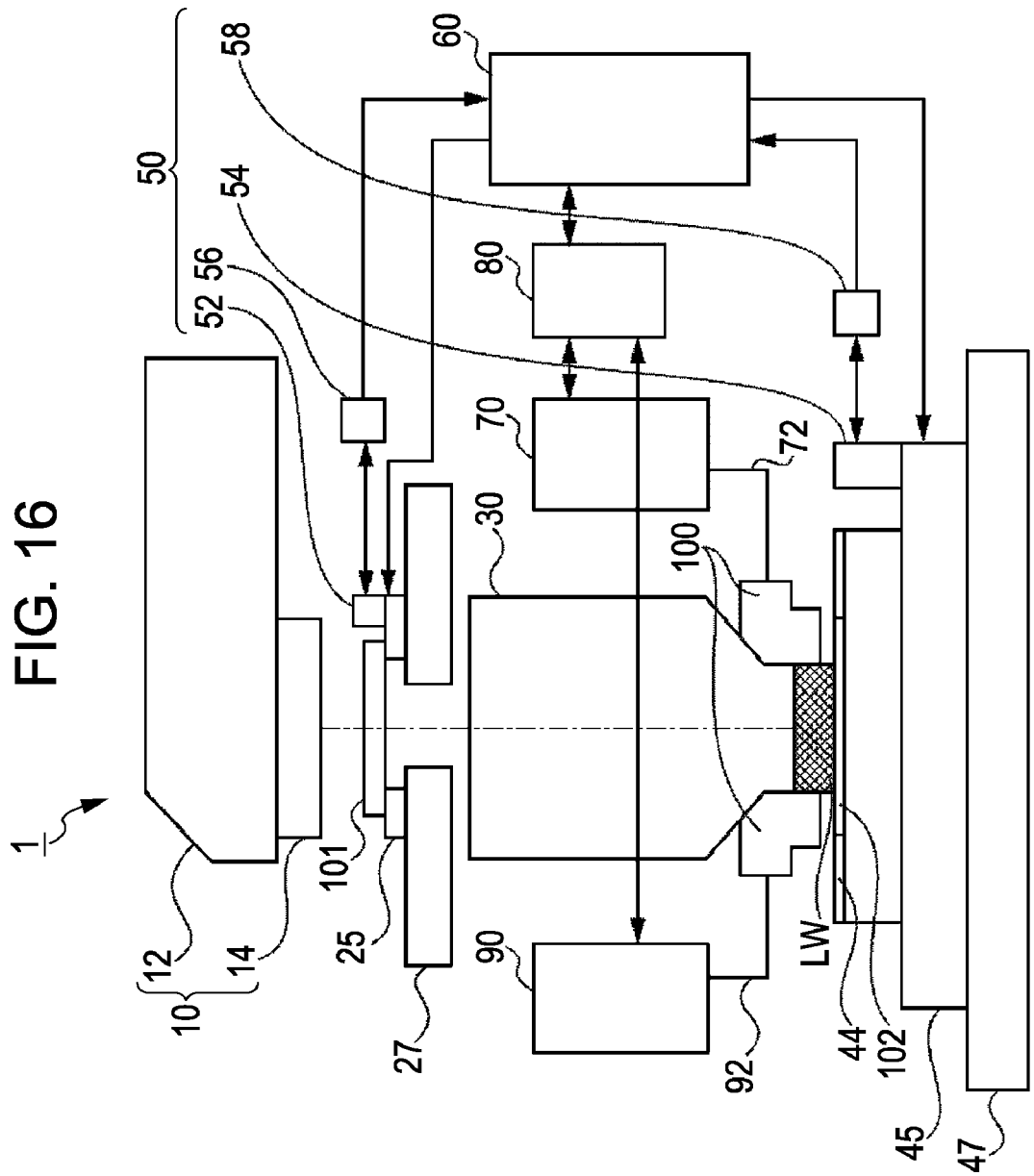

PROJECTION OPTICAL SYSTEM

BACKGROUND OF THE INVENTION

1. Field of the Invention

The present invention generally relates to a projection optical system that projects a pattern on a reticle (mask) onto a substrate. More particularly, though not exclusively, the present invention relates to a catadioptric projection optical system including a lens and a reflecting mirror.

2. Description of the Related Art

Hitherto, a projection exposure apparatus that projects a circuit pattern on a reticle onto a wafer, serving as a substrate, by a projection optical system, and that transfers the circuit pattern onto the wafer has been used. In recent years, the required resolution of the projection optical system is becoming increasingly higher. To achieve the required high resolution of the projection optical system, it is necessary to either reduce the wavelength of exposure light or to increase a numerical aperture NA of the projection optical system.

At present, an ArF laser having a wavelength of 193 nm is used as exposure light. However, since only quartz and fluorite are available as glass materials that efficiently transmit light having a wavelength of 193 nm, it is very difficult to correct chromatic aberration. In addition, increasing the diameter of the glass material due to an increase in NA is a significant factor that increases the cost of the apparatus. In particular, in a projection optical system of an immersion exposure apparatus in which liquid is filled between the projection optical system and the wafer, NA is greater than 1. Therefore, an increase in the diameter of the glass material is a serious problem.

Accordingly, to overcome, for example, the problems regarding the difficulty in correcting chromatic aberration and an increase in the diameter of the glass material, various proposals involving the use of a catadioptric projection optical system, including a reflecting mirror, as a projection optical system have been made (refer to Japanese Patent Laid-Open No. 2001-228401 and the pamphlet of International Publication No. 2005/069055).

The catadioptric projection optical systems discussed in Japanese Patent Laid-Open No. 2001-228401 and the pamphlet of International Publication No. 2005/069055 have common features.

The catadioptric projection optical systems will hereunder be described with reference to FIG. 1. FIG. 1 is a schematic view of the catadioptric projection optical system discussed in Japanese Patent Laid-Open No. 2001-228401. In the projection optical system, a pattern of a first object 101 (reticle), disposed in an object plane, is focused onto a second object 102 (wafer), disposed in an image plane.

Here, a common feature is that the projection optical systems discussed in Japanese Patent Laid-Open No. 2001-228401 and the pamphlet of International Publication No. 2005/069055 each include a first image forming optical system and a second image forming optical system G1 (this common feature will hereunder be referred to as "feature A"). The first image forming optical system includes a reflecting mirror M1 and a concave mirror M2 and forms an intermediate image 180 which is an actual image. The second image forming optical system G1 forms an image of the intermediate image 180. Accordingly, the catadioptric projection optical systems discussed in Japanese Patent Laid-Open No. 2001-228401 and the pamphlet of International Publication No. 2005/069055 have the feature A. In addition, in each of these projection optical systems, an area of a reflecting surface of the reflecting mirror M1 where exposure light is reflected does not include an optical axis 103 of the projection optical system. Further, in each of these projection optical systems, a central portion of a pupil at the projection optical system is not shielded from light (or a pupil plane of the projection optical system is free of a void area).

In each of the catadioptric projection optical systems having the feature A, light from the first object can be reflected by an optical element (such as a lens), making up the image forming optical system G1, other than the reflecting mirror. In this case, light reflected by the optical element may be reflected again by the concave mirror M2 (whose reflecting surface opposes the first object 101) and converged, thereby producing a flare on the second object 102 near the optical axis 103. (The flare will hereunder be referred to as "flare (A).") FIG. 2A shows a distribution of light that is projected onto the image plane when a slit illumination area in the object plane of the catadioptric projection optical system shown in FIG. 24 in Japanese Patent Laid-Open No. 2001-228401 is illuminated with light. In FIG. 2A, reference numeral 301A denotes an image in an illumination area, and reference numeral 302A denotes the flare (A). Referring to FIG. 2A, the flare (A) 302A is produced near the optical axis 103 so as to be separated from the image 301A in the illumination area. Similarly, FIG. 2B shows a distribution of light that is projected onto the image plane when a slit illumination area in the object plane of the catadioptric projection optical system shown in FIG. 30 in the pamphlet of International Publication No. 2005/069055 is illuminated with light. Referring to FIG. 2B, a flare (A) 302B is produced near the optical axis 103 so as to be separated from an image 301B in an illumination area. The flare (A) does not occur only in these projection optical systems. It also occurs in many other catadioptric projection optical systems having the feature (A).

SUMMARY OF THE INVENTION

Accordingly, the present invention is directed to a projection optical system that can maintain high resolution by effectively eliminating flare.

In one aspect, the present invention is a projection optical system that projects an image of a pattern of a first object onto a second object. The projection optical system includes a first image forming optical system, a second image forming optical system, and a light-shielding member. The first image forming optical system forms an intermediate image of the pattern, and includes a concave mirror and a reflecting mirror. The concave mirror has a reflecting surface opposing the second object. The reflecting mirror directs light from the first object to the concave mirror. The second image forming optical system forms an image of the intermediate image onto the second object, and includes a lens. The light-shielding member is disposed between the concave mirror and the lens. An optical axis of the projection optical system does not pass through an area of the reflecting surface of the reflecting mirror where the light from the first object is reflected, and passes through the light-shielding member. A pupil plane of the projection optical system is free of a void area.

In another aspect, the present invention is a projection optical system that projects an image of a pattern of a first object onto a second object. The projection optical system includes a first image forming optical system, a second image forming optical system, and a light-shielding member. The first image forming optical system forms an intermediate image of the pattern, and includes a concave mirror and a reflecting mirror. The concave mirror has a reflecting surface opposing the second object. The reflecting mirror directs light from the first object to the concave mirror. The second image forming optical system forms an image of the intermediate image onto the second object, and includes a lens. The light-shielding member is disposed between the concave mirror and the lens. An optical axis of the projection optical system does not pass through an area of the reflecting surface of the reflecting mirror where the light from the first object is reflected. The light-shielding member has a portion disposed between the area of the reflecting mirror and the light reflected by the concave mirror. The portion of the light-shielding member is disposed in a positive area and a negative area with respect to a first axis corresponding to an ω axis, when a line extending towards an illumination area of the first object is drawn and a direction of the line having a minimum length between the optical axis of the projection optical system and the illumination area defines the first axis, when a direction perpendicular to the first axis and the optical axis defines a second axis corresponding to a ξ axis, and when the optical axis is an origin. A pupil plane of the projection optical system is free of a void area.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention and, together with the description, serve to explain at least some of the principles of the invention.

FIG. 16 is a schematic view of a structure of an exposure apparatus.

DESCRIPTION OF THE EMBODIMENTS

Figure 1:
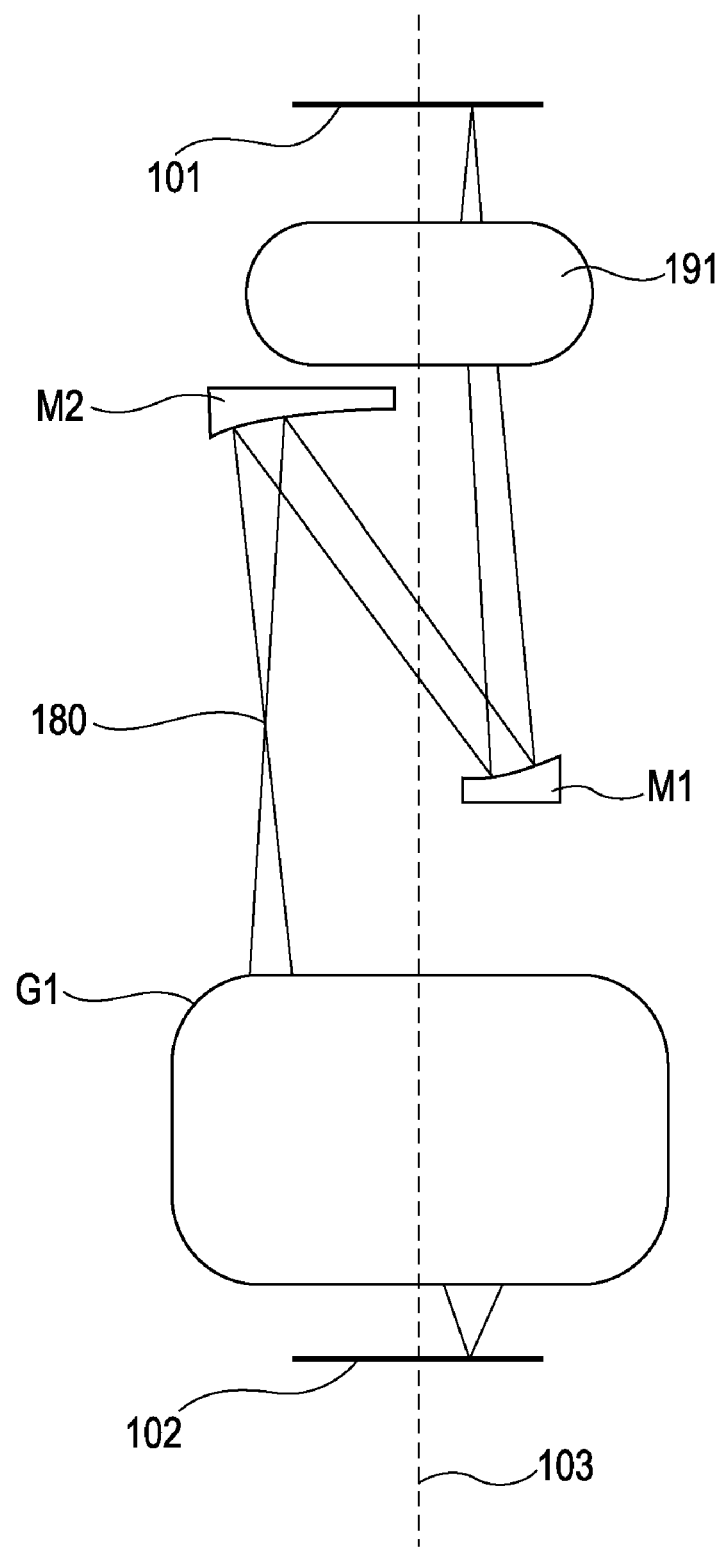
FIG. 1 is a schematic view of a projection optical system.
Figure 2A:
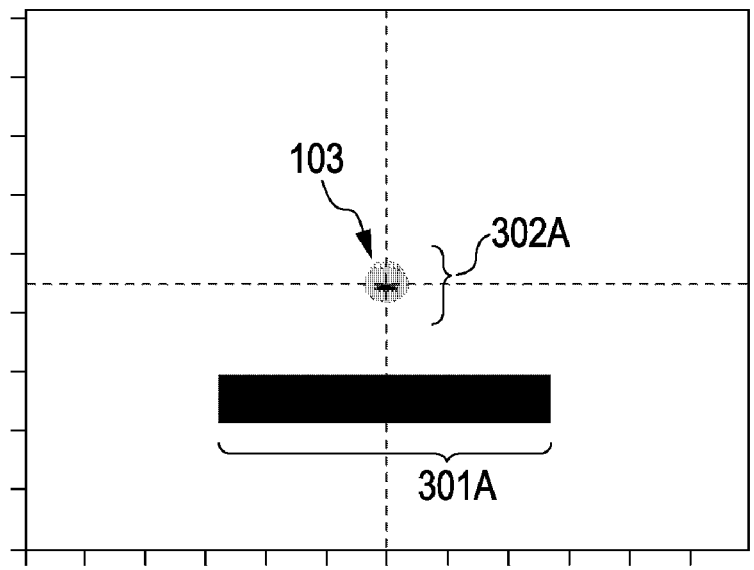
FIG. 2A illustrates light distribution at a second object.
Figure 2B:
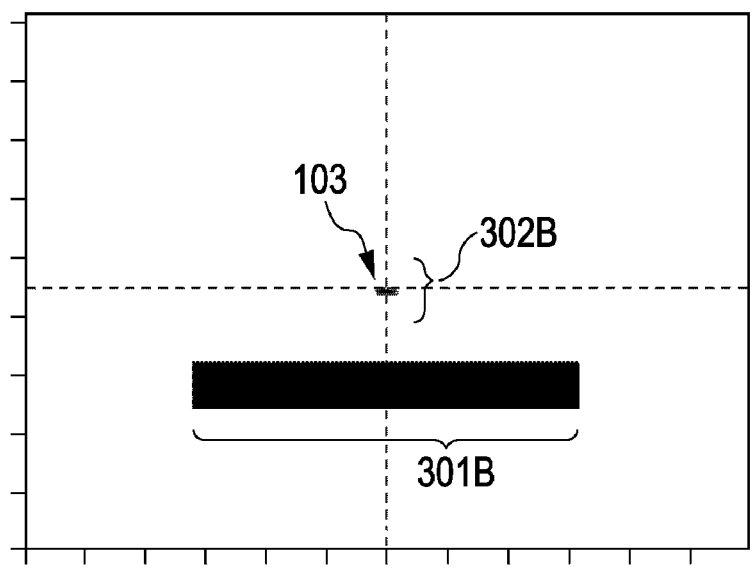
FIG. 2B illustrates light distribution at a second object.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the lens elements and their materials.

In all of the examples illustrated and discussed herein any specific values, for example the zoom ratio and F number, should be interpreted to be illustrative only and non limiting. Thus, other examples of the exemplary embodiments could have different values.

Notice that similar reference numerals and letters refer to similar items in the following figures, and thus once an item is defined in one figure, it can not be discussed for following figures.

Note that herein when referring to correcting or corrections of an error (e.g., an aberration), a reduction of the error and/or a correction of the error is intended. Additionally when referring to preventing a flare from reaching a position (or an object for example the first or second object, or an image plane) it is intended that alternatively a reduction of the flare at the position can be obtained, or the flare can be prevented from directly (e.g., not reflected to the position) reaching the position.

Exemplary embodiments according to the present invention will hereunder be described in detail with reference to the attached drawings. In the figures, corresponding parts are given the same reference numerals, and the same descriptions of the corresponding parts will not be repeated.

First Exemplary Embodiment

Figure 3:
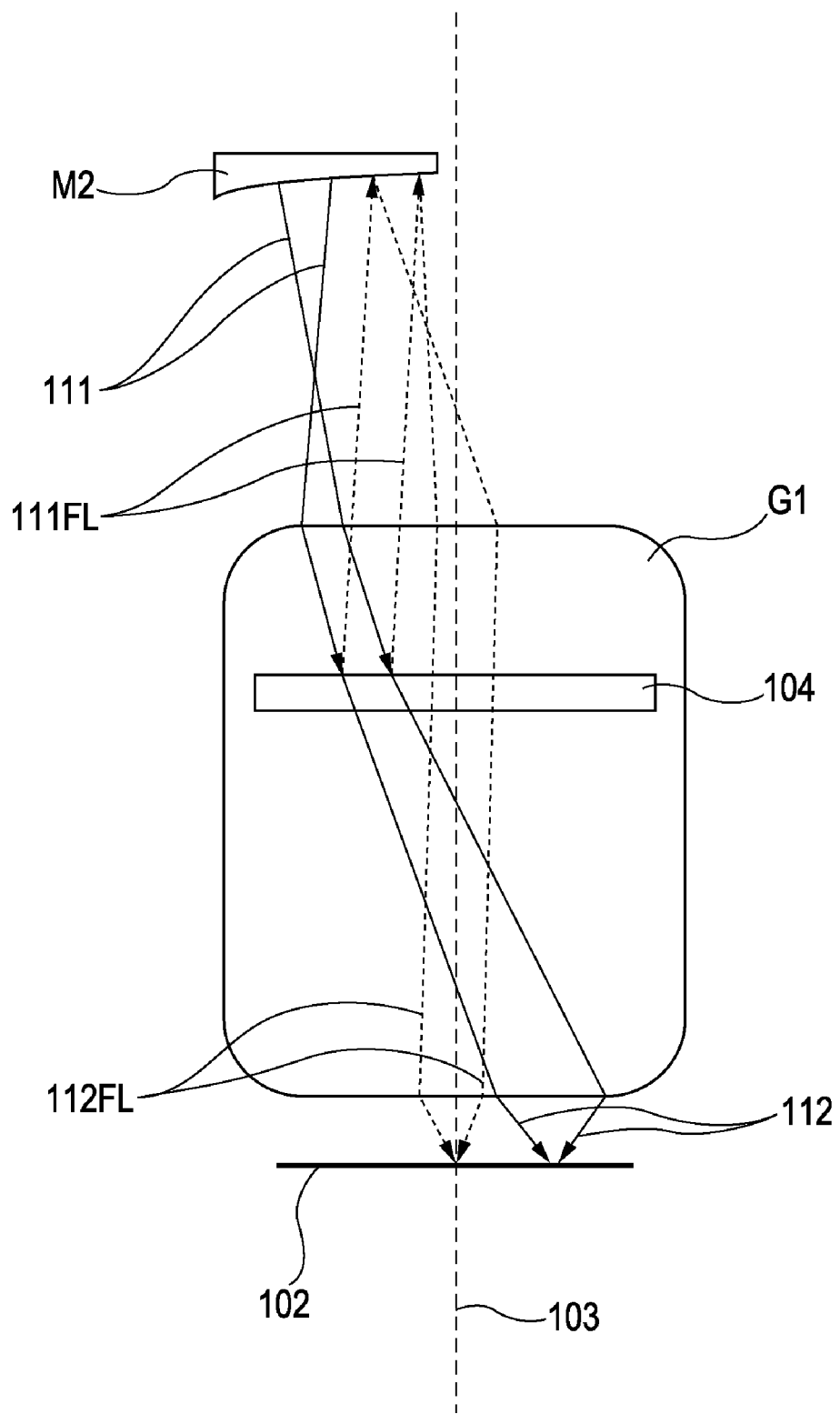
FIG. 3 is a schematic view of the projection optical system.

FIG. 3 is an enlarged view of the vicinity of the second image forming optical system G1 and the concave mirror M2 shown in FIG. 1, and schematically illustrates the feature A.

The flare (A) will hereunder be described in detail with reference to FIG. 3. First, light from a point in an illumination area in the object plane where the first object 101 is disposed is reflected by the reflecting surface of the concave mirror M2, and becomes light 111 that is incident upon the image forming optical system G1. Part of the light 111 is reflected by either a first-object-side surface (front surface) or a second-object-side surface (back surface) of an optical element 104 of the image forming optical system G1, and becomes light 111FL that travels again towards the concave mirror M2. The light 111FL is reflected again by the concave mirror M2, passes through the image forming optical system G1, and becomes flare 112FL that illuminates the second object 102 provided in the image plane. Here, the aforementioned flare (A) corresponds to the flare 112FL. The light 111 passing through the optical element 104 becomes projection light 112, reaches the second object, and forms a pattern of the first object. The projection light 112 is light used to project the pattern of the first object onto the second object. If any lens of the image forming optical system G1 is a diffractive optical element or the image forming optical system G1 includes a diffractive optical element, the optical element 104 is a diffractive optical element.

Here, the flare 112FL is incident upon a portion of the second object 102 near the optical axis. If a light path of the flare 112FL is traced from the second object 102 to the first object 101, and image forming of the image forming optical system G1 is considered, the light path of the flare 112FL in a portion between the image forming optical system G1 and the concave mirror M2 exists near the optical axis. The exemplary embodiment makes use of this fact to reduce the amount of the flare 112FL reaching the second object 102.

A projection optical system 30 according to the exemplary embodiment will be described with reference to FIG. 4.

Figure 4:
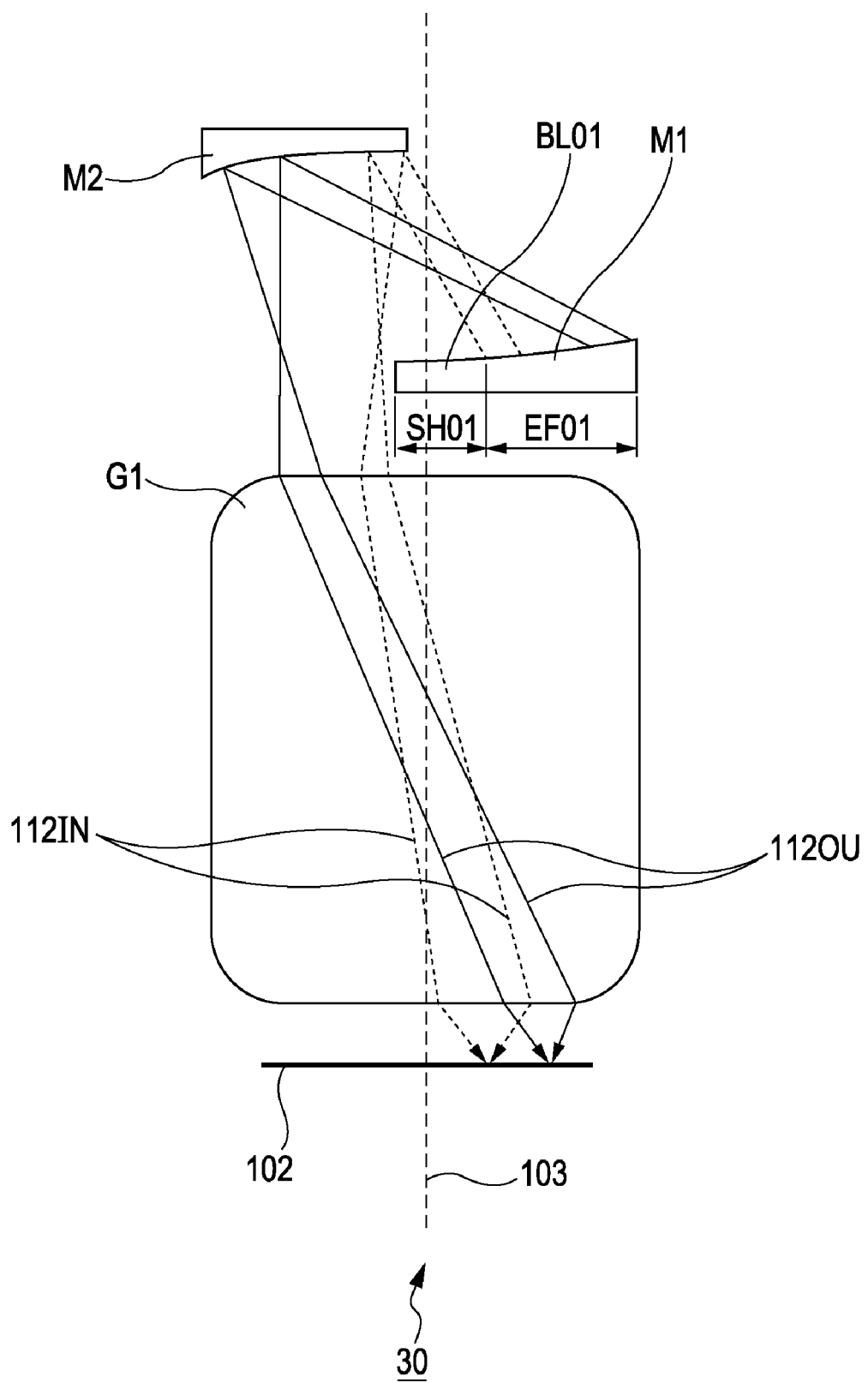
FIG. 4 is a schematic view of another projection optical system.

FIG. 4 is a schematic view of the projection optical system 30 according to the exemplary embodiment. A pupil plane of the projection optical system 30 is free of a void area. Light 112OU is light traveling from a point that is farthest from an optical axis 103 in a slit illumination area (object-side illumination area) in an object plane. In addition, the light 112OU is projection light that is reflected by a reflecting mirror M1, that is, then, reflected by a concave mirror M2, that passes through an image forming optical system G1, and that is incident upon an image plane. Although, in the exemplary embodiment, a concave mirror is used as the reflecting mirror M1, the reflecting mirror M1 can be a planar mirror or a convex mirror. Light 112IN is light traveling from a point that is closest to the optical axis in the object-side illumination area. In addition, the light 112IN is light that is reflected by the reflecting mirror M1, that is, then, reflected by the concave mirror M2, that passes through the image forming optical system G1, and is incident upon the image plane. The optical axis 103 of the projection optical system 30 does not pass through an area EF01 of a reflecting surface of the reflecting mirror M1 where the projection light is reflected. As mentioned above, the flare 112FL passes near the optical axis in the portion between the concave mirror M2 and the image forming optical system G1. Therefore, if a light-shielding member including a light-shielding portion that the optical axis passes through is disposed between the concave mirror M2 and the image forming optical system G1, it is possible to reduce the amount of flare 112FL reaching a second object 102. When the light-shielding member including a light-shielding portion that the optical axis passes through is to be disposed, at the location where the light-shielding member is disposed, all the projection light must pass through an area other than where the optical axis exists so as not to allow the light-shielding member to block the projection light. When the location where no projection light passes the optical axis is also situated in the image forming optical system G1, the light-shielding member can be disposed between optical elements of the image forming optical system G1.

Here, the reflecting mirror M1 exists between the concave mirror M2 and the image forming optical system G1. The projection light between the reflecting mirror M1 and the concave mirror M2 exists in an area extending from the optical axis to a location away from the optical axis. Therefore, to effectively block the flare (A), it is useful to join the light-shielding member to the reflecting mirror M1 or dispose the light-shielding member between the reflecting mirror M1 and the image forming optical system G1, instead of disposing the light-shielding member between the reflecting mirror M1 and the concave mirror M2. When the location where no projection light passes the optical axis also exists in the image forming optical system G1, the light-shielding member can be disposed between optical elements of the image forming optical system G1.

To join the light-shielding member to the reflecting mirror M1, as shown in FIG. 4, an optical axis-side outer peripheral portion SH01 of the reflecting mirror M1 can be extended so as to include the optical axis 103 to form a portion of the reflecting mirror M1 as a light-shielding member BL01.

The front surface or the back surface of the light-shielding member BL01 is formed of a light-shielding material, or is processed for shielding against light, or has a film applied thereto for shielding against light. The shape of the front surface of the light-shielding member BL01 can be a shape that is expressed by a same expression expressing the shape of the reflecting surface of the reflecting mirror M1, or can have its shape modified in accordance with the purpose of shielding against the flare 112FL. For example, the front surface of the light-shielding member BL01 can have the shape of a surface of the area EF01 of the reflecting mirror M1 or any shape that is discontinuous from the outer peripheral portion. To further increase the light-shielding capability, the light-shielding member BL01 can be formed of a material differing from that of the reflecting mirror M1 or can be adhered to the reflecting mirror M1.

A location where the light-shielding member BL01 is set will be described.

Figure 6:
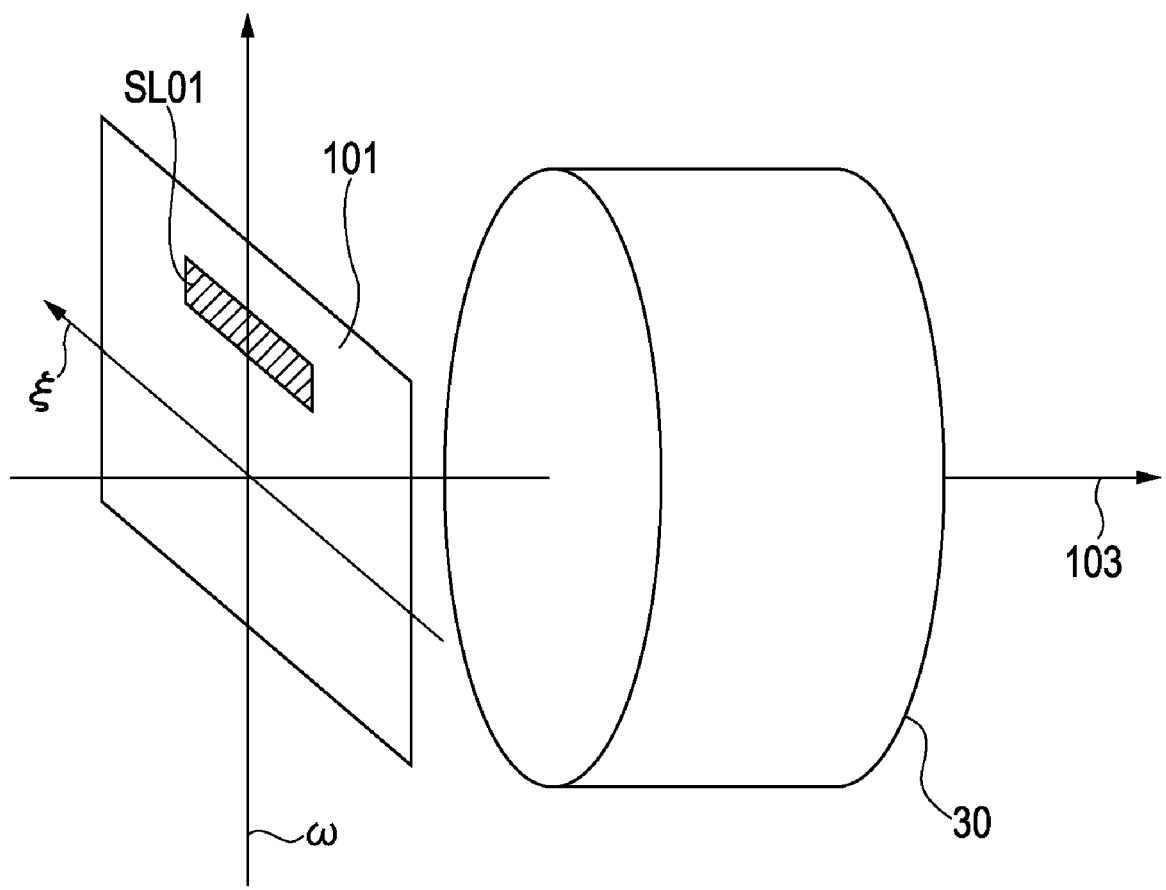
FIG. 6 illustrates an ξ axis and an ω axis.

Here, two axes will be defined with reference to FIG. 6. FIG. 6 is a perspective view showing relationships among the projection optical system 30, the optical axis 103, and the first object 101. A slit illumination area SL01 is formed in the first object 101. Here, a first axis extends in a direction in which the length of a segment of a line extending from the optical axis 103 towards the illumination area SL01 is a minimum. This first axis is called an ω axis. A second axis passes through an intersection of the optical axis 103 and the ω axis, and extends perpendicularly to both the optical axis 103 and the ω axis. This second axis is called an ξ axis.

Figure 7A:
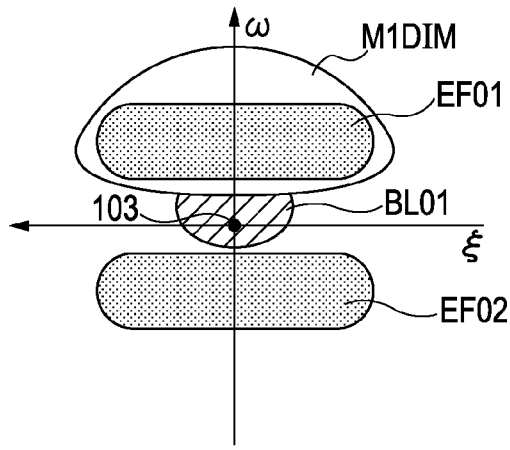
FIG. 7A is a schematic view of a light-shielding member and the vicinity thereof.
Figure 7B:
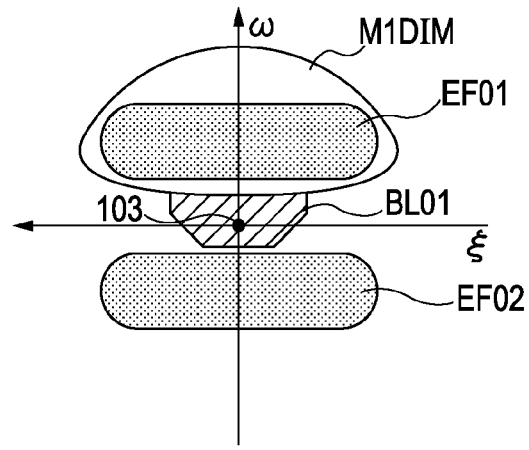
FIG. 7B is a schematic view of another light-shielding member and the vicinity thereof.
Figure 7C:
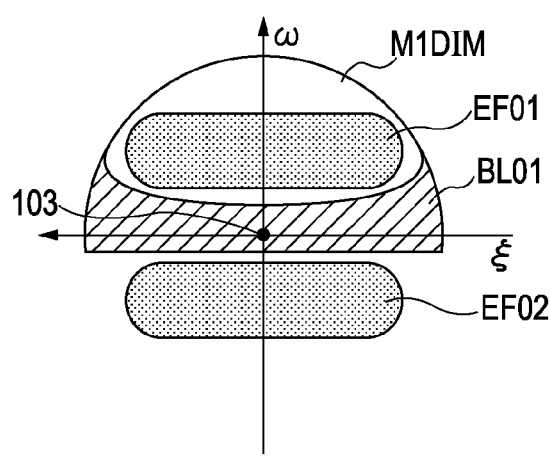
FIG. 7C is a schematic view of still another light-shielding member and the vicinity thereof.
Figure 7D:
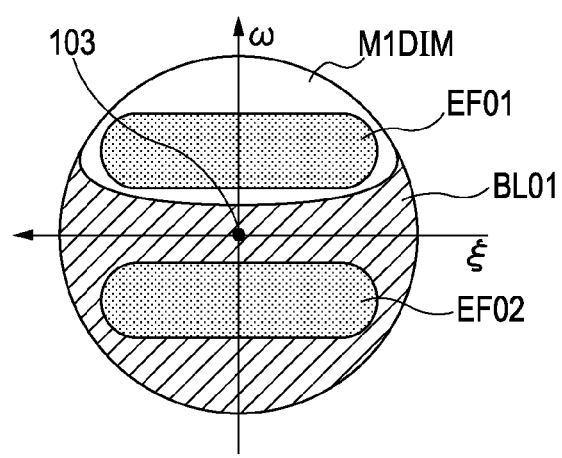
FIG. 7D is a schematic view of still another light-shielding member and the vicinity thereof.

The location where the light-shielding member BL01 is disposed is described with reference to FIG. 7A. FIG. 7A is a schematic plan view of the reflecting mirror M1, and shows relationships among the area EF01 of the reflecting mirror M1, an outer peripheral portion MLDIM of the reflecting mirror M1, the optical axis 103, the ω axis, and the ξ axis. Here, as described in FIG. 4, projection light EF02 used to project a pattern and impinging upon the image forming optical system G1 as a result of being reflected by the concave mirror M2 exists adjacent to the reflecting mirror M1. The light-shielding member BL01 exists closer to the optical axis than the area EF01 of the reflecting mirror M1, exists in a positive area and a negative area with respect to the ω axis, and is provided in an area that does not shield against the projection light EF02. Although, in FIG. 7A, the shape of the light-shielding member BL01 is curved, its shape is not limited thereto. Accordingly, as shown in FIG. 7B, the shape of the light-shielding member BL01 can be defined by straight lines. Further, as shown in FIGS. 7C and 7D, the light-shielding member BL01 can have a shape extending over a wide area. In addition to the shapes shown in FIGS. 7A to 7D, the light-shielding member BL01 can have any selected shape in accordance with the purpose of shielding against the flare 112FL, the difficulty in manufacturing the light-shielding member BL01, and the difficulty in setting the light-shielding member BL01.

Figure 5:
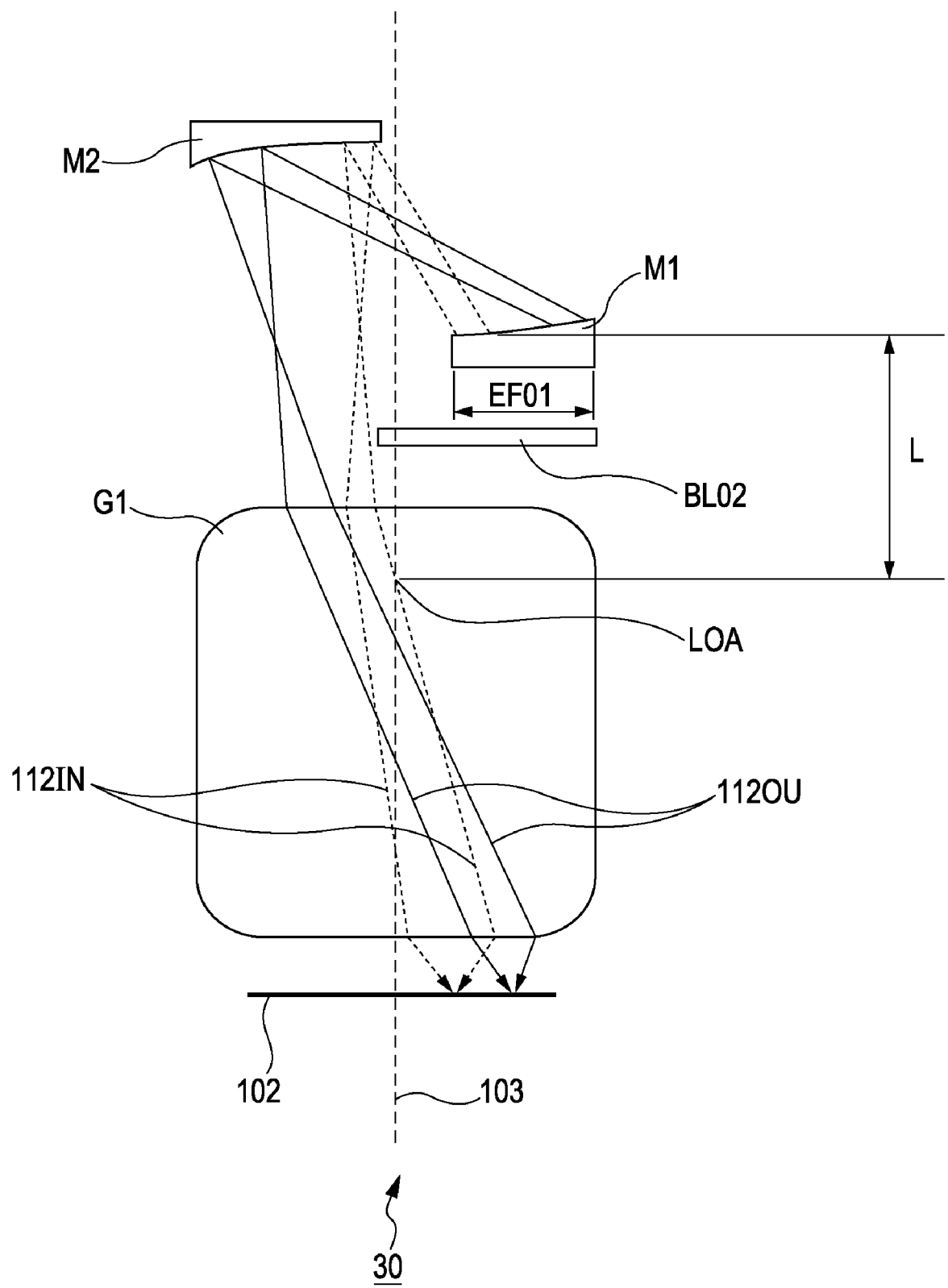
FIG. 5 is a schematic view of still another projection optical system.

As the light-shielding member, a member that is not joined to the reflecting mirror M1 can be used. This member will be described with reference to FIG. 5. In FIG. 5, symbol BL02 denotes the light-shielding member. The location at which the light-shielding member BL02 is set in the optical axis direction is between a location LOA and a concave mirror M2. The location LOA is where light 112IN traveling from a point that is minimum distance from an optical axis 103 in an object-side illumination area intersects the optical axis for the first time after being reflected by the concave mirror M2. Since projection light moves in a forward and a reverse direction in a Z path between the concave mirror M2 and the reflecting mirror M1, it is useful to dispose the light-shielding member BL02 in a range L between the reflecting mirror M1 and the location LOA to easily block the flare (A). Although, in FIG. 5, the front surface and the back surface of the light-shielding member BL02 are shown as being planar surfaces, its surface shapes are not limited thereto. The front and back surfaces thereof can have any selected shape in accordance with the purpose of shielding against flare 112FL.

Figure 8A:
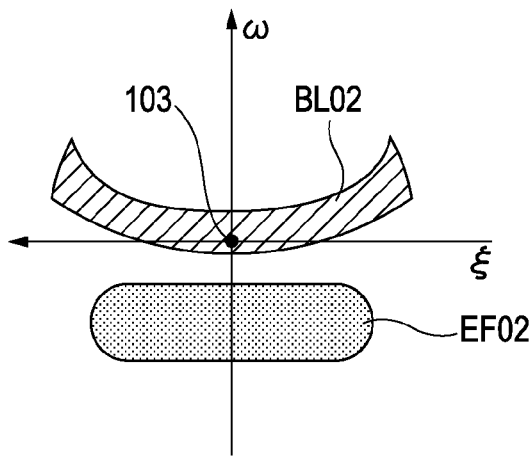
FIG. 8A is a schematic view of a light-shielding member and the vicinity thereof.

Next, the area where the light-shielding member BL02 is set will be described. FIG. 8A is a schematic sectional view of the light-shielding member BL02, and shows relationships among projection light EF02, used to project a pattern, an ω axis, and a ξ axis. The light-shielding member BL02 exists closer to the optical axis than at least the projection light EF02, exists in a positive area and a negative area with respect to the ω axis, and is provided in an area that does not shield against the projection light EF02. The light-shielding member BL02 has a portion disposed between the area EF01 and the projection light EF02, and the portion is disposed in the positive area and the negative area with respect to the ω axis.

Figure 8B:
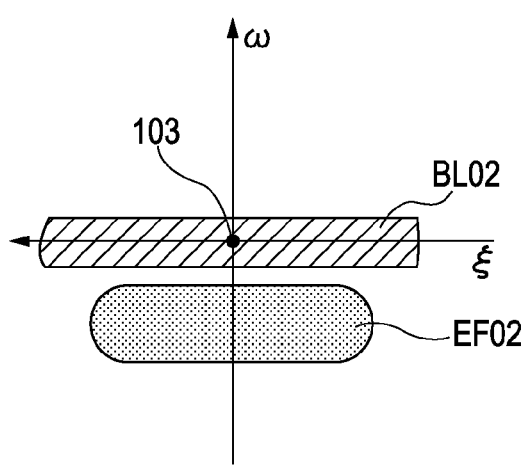
FIG. 8B is a schematic view of another light-shielding member and the vicinity thereof.
Figure 8C:
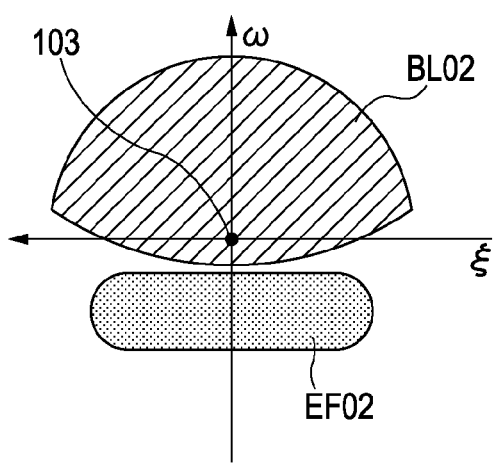
FIG. 8C is a schematic view of still another light-shielding member and the vicinity thereof.
Figure 8D:
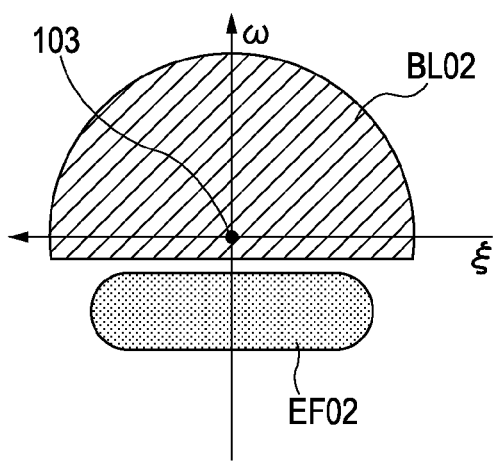
FIG. 8D is a schematic view of still another light-shielding member and the vicinity thereof.
Figure 8E:
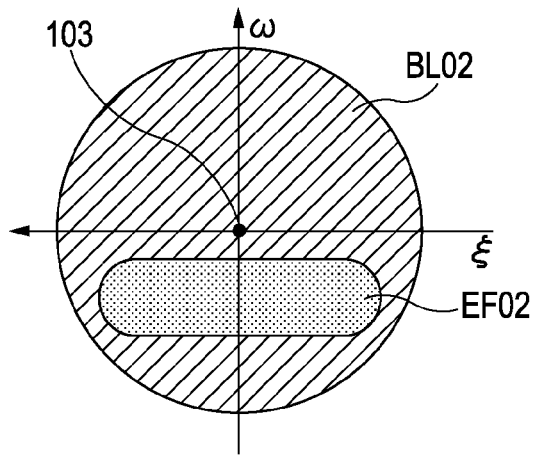
FIG. 8E is a schematic view of still another light-shielding member and the vicinity thereof.
Figure 8F:
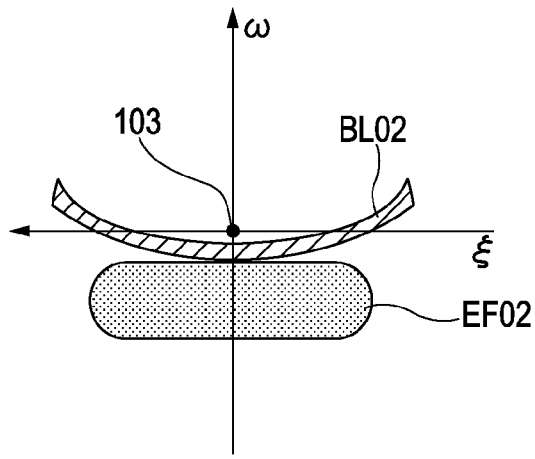
FIG. 8F is a schematic view of still another light-shielding member and the vicinity thereof.

Although, in FIG. 8A, the shape of the light-shielding member BL02 is curved, its shape is not limited thereto. Accordingly, as shown in FIG. 8B, the shape of the light-shielding member BL02 can be defined by straight lines. Further, as shown in FIGS. 8C to 8E, the light-shielding member BL02 can have a shape extending over a wide area. When, for example, the flare 112FL is not produced on the optical axis, as shown in FIG. 8F, the light-shielding member BL02 can have a shape not including the optical axis. In addition to the shapes shown in FIGS. 8A to 8F, the light-shielding member BL02 can have any selected shape in accordance with the purpose of shielding against the flare 112FL, the difficulty in manufacturing the light-shielding member BL02, and the difficulty in setting the light-shielding member BL02.

It is useful that at least a portion of the light-shielding member BL01 and a portion of the light-shielding member BL02 be set within an area of radius R expressed by the following Expression (1) with the optical axis as a center:

$$R = D \times \tan(\arcsin|NA \times \beta/n|) \qquad (1)$$

In Expression (1), D denotes a distance between a paraxial image forming position, situated at a first object side of the image forming optical system G1, and the light-shielding portion of the light-shielding member BL01 or BL02 on the optical axis, and NA denotes a numerical aperture at a second object side of the image forming optical system G1 (that is, a numerical aperture at the second object side of the projection optical system 30). In addition, β denotes imaging magnification of the image forming optical system G1 towards the second object side, and n denotes refractive index of a material with respect to exposure light. The paraxial image forming position (paraxial intermediate image position) at the first object side of the image forming optical system G1 is provided with the material.

Expression (1) will be described below. By making use of the fact that the flare 112FL is converged near the optical axis on the second object, a case in which light is emitted from the optical axis on the second object towards the first object is considered. When incident light from the optical axis on the second object has an angle of incidence that is equal to or greater than the numerical aperture at the second object side, light shielding occurs at an aperture stop disposed in the image forming optical system G1. Therefore, the angle of a light beam reaching the paraxial image forming point at the first object side of the image forming optical system G1 is $(\arcsin|NA \times \beta/n|)$ at most. Consequently, even if light flux at a location that is separated by the distance D from the paraxial image forming point at the first object side of the image forming optical system G1 is a maximum, the angle of the light beam is $D \times \tan(\arcsin|NA \times \beta/n|)$. If an area on the second object illuminated by the flare 112FL is previously known by simulation, the following Expression (2) can be used:

$$R = |T/\beta| + |D \times \tan(\arcsin|NA \times \beta/n|)| \qquad (2)$$

Here, T denotes a maximum distance of the illumination area on the second object illuminated by the flare 112FL from the optical axis of the projection optical system 30. Expression (2) differs from Expression (1) in that light emitted from a point that is separated by the maximum distance T from the optical axis on the second object is also considered.

Figure 9A:
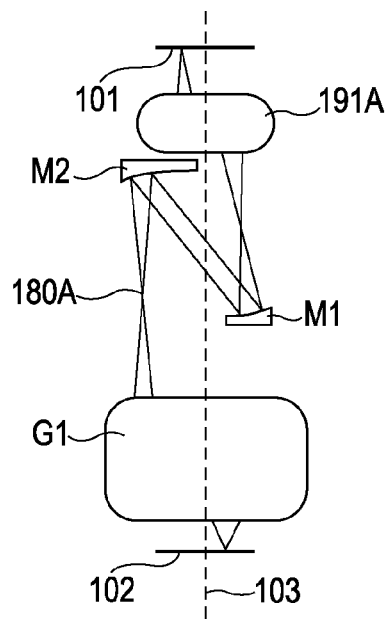
FIG. 9A is a schematic view of a projection optical system.
Figure 9B:
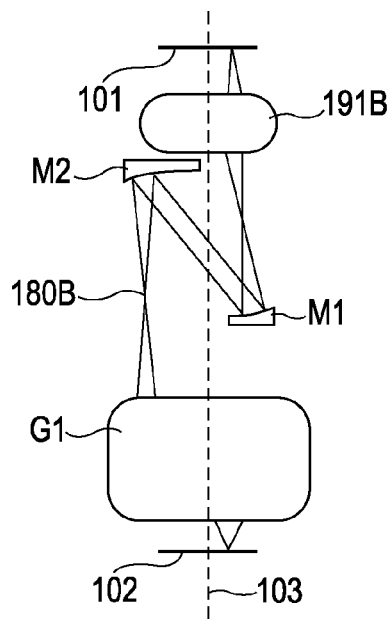
FIG. 9B is a schematic view of another projection optical system.

In the foregoing description, a projection optical system like that shown in FIG. 1 is used. In the structure shown in FIG. 1, a light beam emitted from the first object passes through a lens unit 191 (which can include a mirror), is reflected by the reflecting mirror M1 and then by the concave mirror M2, forms an intermediate image 180 (actual image), passes through the image forming optical system G1, and reaches the second object. The structure can include a reciprocating optical system disposed between the reflecting mirror M1 and the concave mirror M2. Here, the reciprocating optical system is an optical system through which projection light, used to project a pattern, passes a plurality of times. The reciprocating optical system includes at least a lens having a negative refractive power. Intermediate image forming operations from the first object to the second object can be performed two times, three times, or more than three times. Accordingly, as shown in FIGS. 9A and 9B that are schematic views, a projection optical system in which the first image forming optical system includes a plurality of image forming optical systems is also a projection optical system according to the present invention. The projection optical system shown in FIG. 9A (or FIG. 9B) includes a lens unit 191A (or 191B) that forms at least one intermediate image, a reflecting mirror M1 and a concave mirror M2 that form an intermediate image 180A (or 180B) that is an actual image, and an image forming optical system G1. The lens unit 191A (or 191B) can include a mirror. In addition, the projection optical system can include a reciprocating optical system provided between the reflecting mirror M1 and the concave mirror M2. The reciprocating optical system includes, for example, at least one lens having a negative refractive power.

Figure 9C:
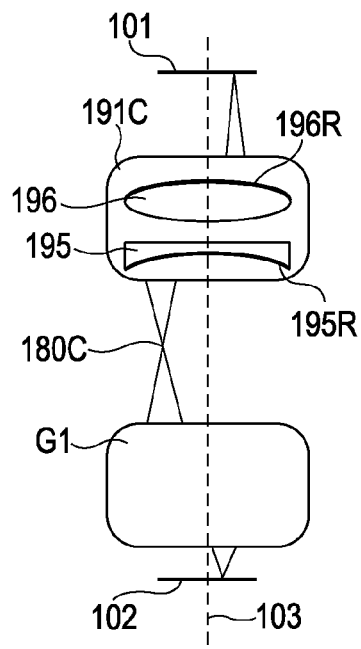
FIG. 9C is a schematic view of still another projection optical system.

Although the exemplary embodiment is described using a catadioptric projection optical system, the same problems arise even in a dioptric projection optical system. For example, in a dioptric projection optical system shown in FIG. 9C, flare that is similar to the flare A is produced. The flare will be described with reference to FIG. 9C. FIG. 9C is a schematic view of the dioptric projection optical system in which an intermediate image is formed between a first object 101 and a second object 102. Light from the first object 101 passes through a lens unit 191C, forms an intermediate image 180C (actual image), passes through an image forming optical system G1, and reaches the second object 102. The lens unit 191C includes at least one lens having a surface (hereunder referred to as "concave surface (A)") that has a center-of-curvature point situated closer to the second object than to an intersection point of the front surface (or back surface) of the lens and the optical axis. The concave surface (A) can correspond to, for example, a concave surface 195R of a lens 195 of the lens unit 191C or a concave surface 196R of a lens 196 of the lens unit 191C. Here, considering that light is reflected by the concave surface (A), the dioptric projection optical system shown in FIG. 9C includes, as viewed from the second object 102, the image forming optical system G1 and the concave surface that reflects light. Accordingly, the dioptric projection optical system has the structure having the above-described feature A. Therefore, even in the optical system shown in FIG. 9C, flare (hereunder referred to as "flare (B)") that is similar to the flare (A) is produced. The flare (B) produced at the projection optical system shown in FIG. 9C can be prevented from reaching the second object by providing a light-shielding member BL02'.

Figure 9D:
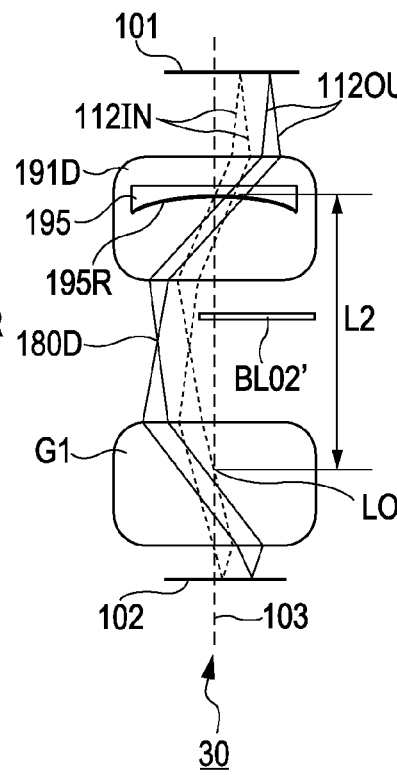
FIG. 9D is a schematic view of still another projection optical system.

This will be described with reference to FIG. 9D. FIG. 9D shows a projection optical system 30 and the light-shielding member BL02'. For the purpose of eliminating flare, the projection optical system shown in FIG. 9D uses an illumination area that does not include an optical axis in an object plane. Light 112OU emitted from one point that is farthest from the optical axis in the object-side illumination area passes through a lens unit 191D, forms an intermediate image 180D (actual image), passes through an image forming optical system G1, and is focused on a second object 102. Light 112IN emitted from one point that is closest to the optical axis in the object-side illumination area passes through the lens unit 191D, forms an intermediate image 180D (actual image), passes through the image forming optical system G1, and is focused on the second object 102. An area where no projection light, used to project a pattern, includes the optical axis exists near the intermediate image 180D. The light-shielding member BL02' is similar to the light-shielding member BL02, and is disposed in a range L2 between a concave surface (A) and a location LOA where the light 112IN intersects the optical axis for the first time after exiting from the lens unit 191D.

A plurality of light-shielding members can be provided in accordance with the number of optical elements having surfaces corresponding to the concave surface (A) of the lens unit 191D. Although, in FIG. 5, both the front and back surfaces of the light-shielding member BL02' are planar surfaces, the surfaces can have any selected shapes in accordance with the purpose of shielding against the flare (B). The light-shielding member BL02' is provided in the range L2 so as exist in a positive area and a negative area with respect to a ω axis and in an area that does not shield against projection light used to project a pattern. The light-shielding member BL02' can have any selected shape in accordance with the purpose of shielding against the flare (B), the difficulty in manufacturing the light-shielding member BL02', and the difficulty in setting the light-shielding member BL02'.

Figure 9E:
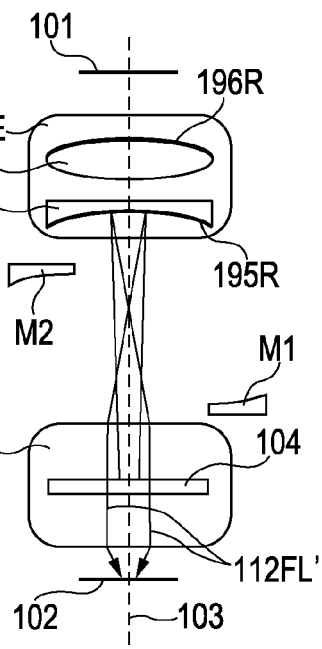
FIG. 9E is a schematic view of still another projection optical system.

Even in a catadioptric projection optical system having the feature A, the flare (A) is reduced, but the flare (B) is produced, when, for example, as shown in FIG. 9E, a reflecting area and an outer peripheral portion of a reflecting mirror M1 and those of a concave mirror M2 are separated from an optical axis.

This will be described with reference to FIG. 9E. Light reflected by the front surface or the back surface of an optical element 104 of an image forming optical system G1 can pass the vicinity of the optical axis without being reflected by the concave mirror M2 or the reflecting mirror M1. This light is reflected by a concave surface (A) 195R (or 196R), and becomes flare 112' that is converged on a second object 102. The present invention is effective in eliminating the flare (B) produced in the catadioptric projection optical system having the feature (A).

Figure 10A:
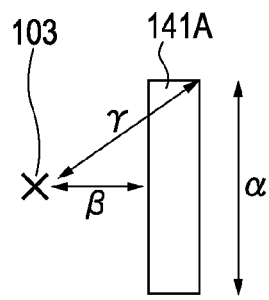
FIG. 10A is a schematic view of an illumination area.
Figure 10B:
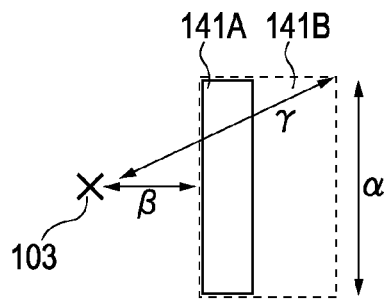
FIG. 10B is a schematic view of another illumination area.
Figure 10C:
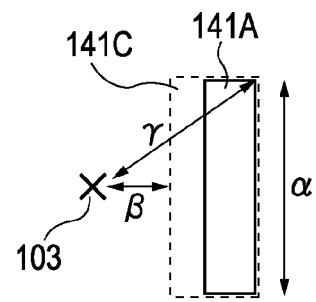
FIG. 10C is a schematic view of still another illumination area.
Figure 10D:
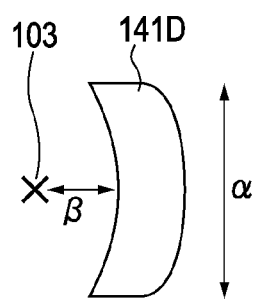
FIG. 10D is a schematic view of still another illumination area.
Figure 10E:
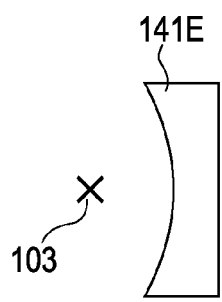
FIG. 10E is a schematic view of still another illumination area.
Figure 10F:
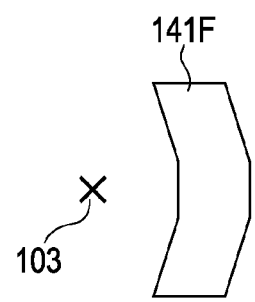
FIG. 10F is a schematic view of still another illumination area.
Figure 10G:
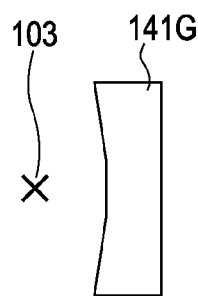
FIG. 10G is a schematic view of still another illumination area.
Figure 10H:
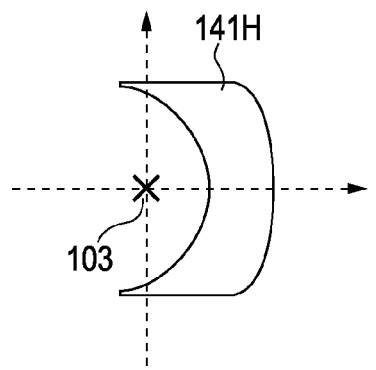
FIG. 10H is a schematic view of still another illumination area.
Figure 10I:
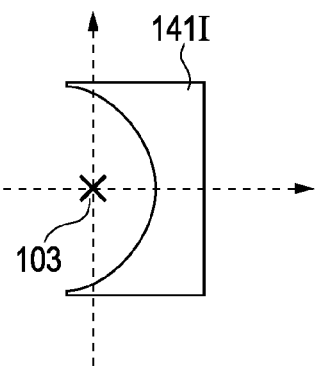
FIG. 10I is a schematic view of still another illumination area.

High throughput can be achieved by enlarging a slit illumination area. FIG. 10A shows an example illustrating a relationship between an optical axis 103 and an illumination area 141A of a second object 102. Reference numeral 141A denotes the illumination area, α denotes a longitudinal distance of the illumination area, β denotes a minimum distance between the illumination area and the optical axis 103, and γ denotes a maximum distance between the illumination area and the optical axis 103. Since it becomes difficult to correct aberrations as the maximum distance γ is increased, it becomes difficult to widen the illumination area in the direction in which the maximum distance γ is increased so as to form an illumination area 141B shown by broken lines in FIG. 10B. When the illumination area is widened in the direction in which the minimum distance β is reduced so as to form an illumination area 141C shown by broken lines in FIG. 10C, the illumination area, illuminated by projection light, used to project a pattern, at a surface of a concave mirror M2 comes closer to the optical axis. This causes a location LOA, where the projection light exiting from the concave mirror M2 intersects the optical axis, to come closer to the concave mirror M2, thereby essentially narrowing the area where a light-shielding member can be set. If the illumination area is not a rectangular area like the illumination area 141A, it is possible to have a wide illumination area while having sufficient space for setting the light-shielding member. For example, if the illumination area has either of the shapes of illumination areas 141D and 141E shown in FIGS. 10D and 10E, respectively, the illumination area can be made wide without increasing the maximum distance γ or reducing the minimum distance β. A portion of each of the illumination areas 141D and 141E situated closer to the optical axis can have either of the shapes of illumination areas 141H and 141I shown in FIGS. 10H and 10I, respectively. Further, the illumination area can have either of the polygonal shapes of illumination areas 141F and 141G shown in FIGS. 10F and 10G, respectively. To widen the illumination area without increasing the maximum distance γ or reducing the minimum distance β, the illumination area can have a form other than those shown in FIGS. 10A to 10I.

Figure 12A:
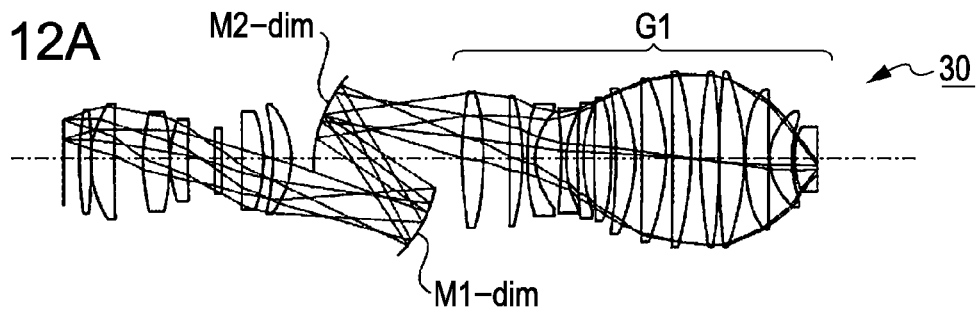
FIG. 12A shows a projection optical system.
Figure 12B:
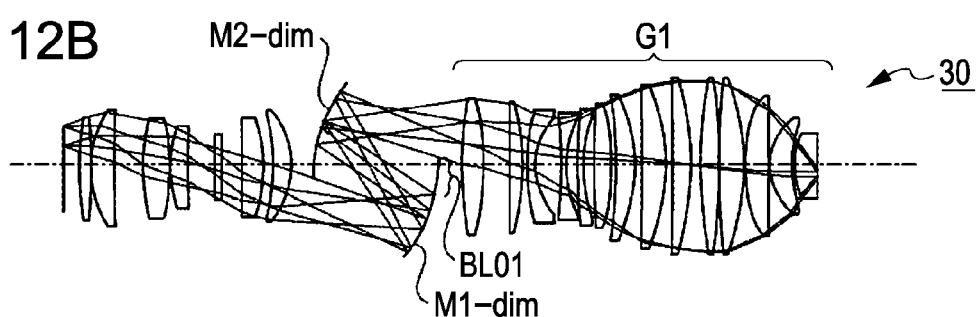
FIG. 12B shows another projection optical system.
Figure 13A:
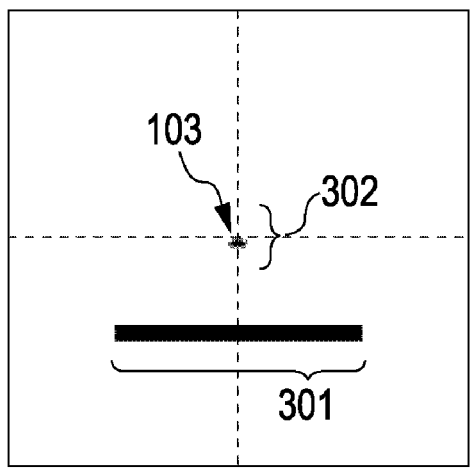
FIG. 13A shows light distribution at a second object.
Figure 13B:
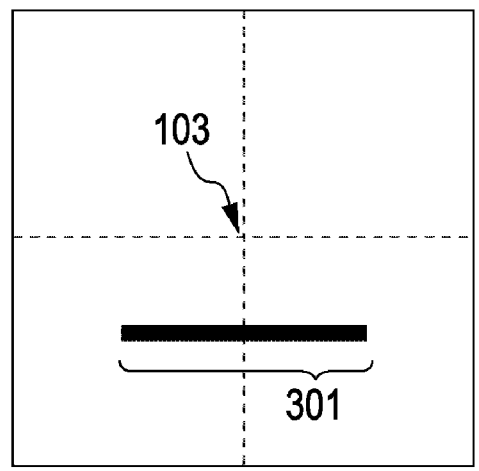
FIG. 13B shows light distribution at a second object.

An application of at least one exemplary embodiment of the present invention to the catadioptric projection optical system (hereunder referred to as "projection optical system A") that is discussed with reference to Tables 30 and 30A in the pamphlet of International Publication No. 2005/069055 will be described which are incorporated herein by reference in their entirety. FIG. 12A is a schematic view of a light path when an illumination area (measuring 104 mm×5.6 mm) in an object plane where a first object is disposed is illuminated with light. M1-dim denotes a reflecting portion and an outer peripheral portion of a reflecting mirror M1, and M2-dim denotes a reflecting portion and an outer peripheral portion of a concave mirror M2. FIG. 13A shows a distribution of light illuminating an image plane where a second object is disposed, when the illumination area in the object plane is illuminated with light in the projection optical system shown in FIG. 12A. In FIG. 13A, reference numeral 301 denotes the illumination area subjected to projection, and reference numeral 302 denotes the flare (A). A projection optical system 30 shown in FIG. 12B corresponds an optical system in which the present invention is applied to the projection optical system shown in FIG. 12A. FIG. 12B shows a light-shielding member BL01 that is provided at M1-dim representing the reflecting portion and the outer peripheral portion of the reflecting mirror M1 in the projection optical system shown in FIG. 12A. FIG. 13B shows a distribution of light illuminating the image plane when the illumination area in the object plane is illuminated with light in the projection optical system shown in FIG. 12B. As can be understood by comparing FIGS. 13B and 13A, the application of the present invention makes it possible to prevent the flare (A) from reaching the image plane.

Figure 12C:
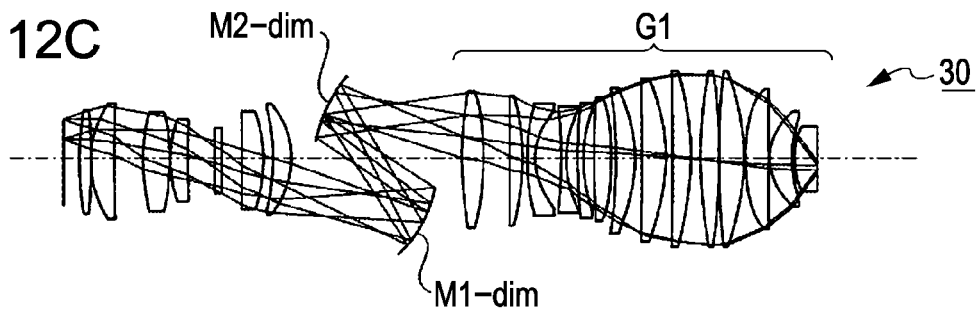
FIG. 12C shows still another projection optical system.
Figure 12D:
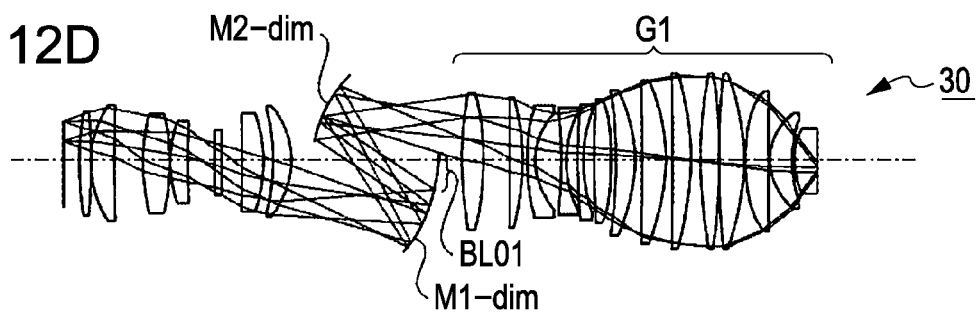
FIG. 12D shows still another projection optical system.
Figure 13C:
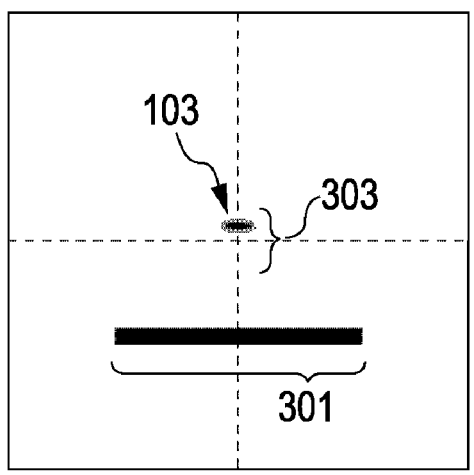
FIG. 13C shows light distribution at a second object.
Figure 13D:
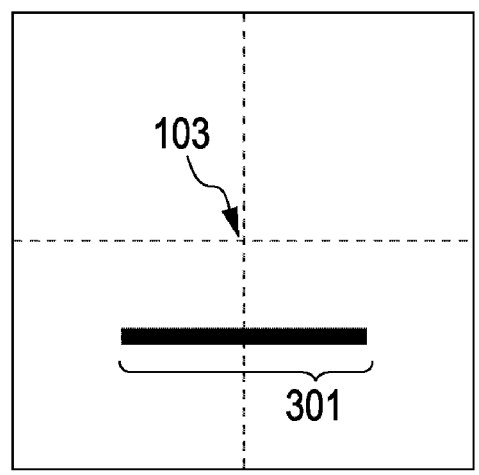
FIG. 13D shows light distribution at a second object.

In the projection optical system shown in FIG. 12A, the reflecting portion and outer peripheral portion M2-dim of the concave mirror M2 includes the optical axis. A projection optical system in which M2-dim is separated from the optical axis will be described below. FIG. 12C shows the projection optical system in which M2-dim of the projection optical system shown in FIG. 12A is separated from the optical axis. In the projection optical system shown in FIG. 12C, since a reflecting mirror M1 and a concave mirror M2 are separated from the optical axis, the flare (B) is produced. FIG. 13C shows a distribution of light illuminating an image plane, when an illumination area in a object plane is illuminated with light in the projection optical system shown in FIG. 12C. In FIG. 13C, reference numeral 301 denotes the illumination area subjected to projection, and reference numeral 303 denotes the flare (B). A projection optical system 30 shown in FIG. 12D corresponds to an optical system in which the present invention is applied to the projection optical system shown in FIG. 12C. FIG. 12D shows a light-shielding member BL01 that is provided at M1-dim representing a reflecting portion and an outer peripheral portion of the reflecting mirror M1 in the projection optical system shown in FIG. 12C. FIG. 13D shows a distribution of light illuminating an image plane when an illumination area in an object plane is illuminated with light in the projection optical system shown in FIG. 12D. As can be understood by comparing FIGS. 13D and 13C, the application of the present invention makes it possible to prevent the flare (B) from reaching the image plane.

Figure 11A:
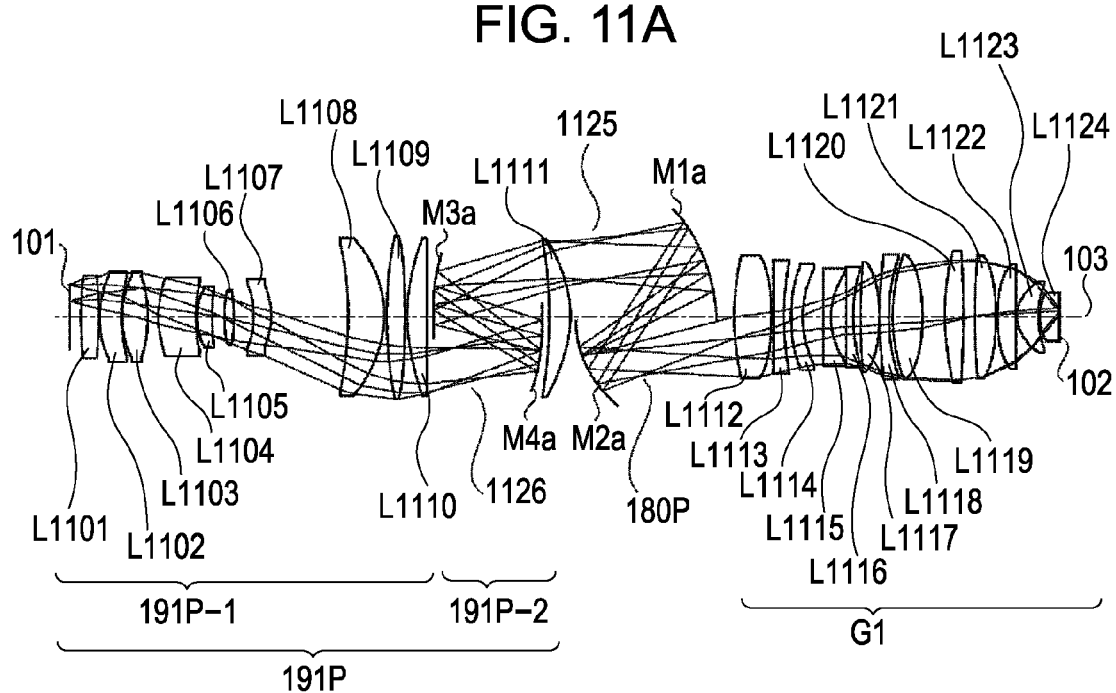
FIG. 11A is a schematic view of a projection optical system.
Figure 11B:
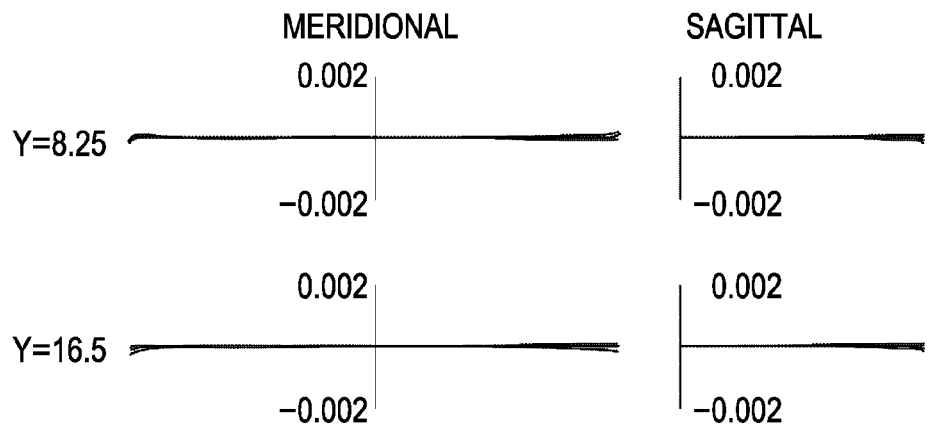
FIG. 11B shows graphs of transverse aberration of the projection optical system.

A practical form to which at least one exemplary embodiment of the present invention is applied will be described below. A specific lens structure according to the practical form described below is shown in FIG. 11A. As shown in FIG. 11A, an image forming optical system 191P, an intermediate image 1125 (actual image), a reflecting mirror M1a, a concave mirror M2a, an intermediate image 180P (actual image), and an image forming optical system G1 are provided along a light path in that order from a first object 101 side. In the practical form, the image forming optical system 191P includes a refractive lens unit 191P-1, a first intermediate image 1126 (actual image), and a catadioptric lens unit 191P-2, which are disposed in the light path in that order from the first object 101 side. The catadioptric lens unit 191P-1 includes lenses L1101 to L1110. More specifically, it includes, in the order of lenses from the first object side, the aspherical positive lens L1101 having a substantially plano-convex form and whose substantially planar surface faces the first object, the meniscus aspherical positive lens L1102 whose convex surface faces the first object, the biconvex positive lens L1103, a meniscus positive lens L1104 whose convex surface faces the first object, the meniscus aspherical positive lens L1105 whose convex surface faces the first object, the biconvex positive lens L1106, the meniscus aspherical positive lens 1107 whose concave surface faces the first object, the meniscus positive lens L1108 whose convex surface faces a second object, the biconvex positive lens L1109, and the positive lens L1110 having a substantially plano-convex form and whose convex surface faces the first object. The catadioptric lens unit 191P-2 includes a concave mirror M4a, a concave mirror M3a, and a meniscus positive lens L1111 whose convex surface faces the second object. The image forming optical system G1 includes lenses L1112 to L1124. More specifically, it includes, in the following order, the biconvex positive lens L1112, the aspherical negative lens L1113 having a substantially plano-concave form and whose concave surface faces the second object, the meniscus negative lens L1114 whose concave surface faces the second object, the negative lens L1115 having a substantially plano-concave form and whose concave surface faces the second object, the biconcave aspherical negative lens L1116 whose concave surface faces the second object, the biconvex positive lens L1117, the meniscus aspherical negative lens L1118 whose concave surface faces the second object, the biconvex aspherical positive lens L1119, the biconvex positive lens L1120, the biconvex aspherical positive lens L1121, the aspherical positive lens L1122 having a substantially plano-convex form and whose convex surface faces the first object, the meniscus positive lens L1123 whose concave surface faces the second object, and a plano-convex positive lens L1124 whose planar surface faces the second object. A portion between the positive lens L1124 and the second object 102 is formed of a liquid. Although, in the exemplary embodiment, an aperture stop (not shown) is disposed between the lenses L1120 and L1121, its position is not limited thereto. In the exemplary embodiment, a projection magnification is ¼×, a reference wavelength is 193 nm, and quartz is used as glass material. A numerical aperture NA at the image side is 1.20, and a distance L between the object plane and the image plane is approximately 1879 mm. Aberrations are corrected at an image height in the range of from approximately 8.25 mm to 16.5 mm. Accordingly, it is possible to provide a paraxial rectangular illumination area having at least a length of 22 mm and a width of approximately 4 mm. The shape of the illumination area is not limited to a rectangular shape, so that, for example, it can be arc-shaped. Transverse aberration in the exemplary embodiment is illustrated in FIG. 11B. FIG. 11B shows the transverse aberration for the reference wavelength of 193 nm and wavelengths of ±0.2 μm. It can be seen that monochromatic aberration and chromatic aberration are properly corrected.

Various structural features according to the exemplary embodiment will be illustrated in Table 1 below. In Table 1, i denotes a surface number in a direction of propagation of light from the first object 101, ri denotes a curvature radius of a surface corresponding to its associated surface number, and di denotes a distance between each surface. The refractive indices of a lens glass material $SiO_2$ and pure water with respect to the reference wavelength $\lambda$ of 193.00 nm are 1.5609 and 1.437, respectively. The refractive indices of the wavelengths of ±0.2 pm and −0.2 pm with respect to the reference wavelength are 1.56089968 and 1.56090031, respectively, for $SiO_2$, and are 1.43699576 and 1.437000424, respectively, for pure water.

The aspherical shape is defined by the following Expression (3):

$$X=(H2/4)/(1+((1-(1+K)\cdot(H/r)2))^{1/2})+AH4+BH6+CH8+DH10+EH12+FH14+GH16 \quad (3)$$

Here, X denotes an amount of displacement from a lens apex in the optical axis direction, H denotes a distance from the optical axis, r denotes a curvature radius, k denotes a conic constant, and A, B, C, D, E, F, and G denote aspherical coefficients.

TABLE 1

L = 1878.58 mm
β = ¼
NA = 1.2
DISTANCE FROM FIRST OBJECT TO FIRST SURFACE: 25.1988136 mm

| i | ri | di | GLASS MATERIAL |
|---|---|---|---|
| 1 | 10146.9718866 | 33.2755526 | SiO2 |
| 2 | −696.7827581 | 1.5905812 | |
| 3 | 223.0472383 | 41.4489485 | SiO2 |
| 4 | 621.0742962 | 2.3933843 | |
| 5 | 223.4437769 | 46.3931808 | SiO2 |
| 6 | −310.1995424 | 20.9356787 | |
| 7 | 281.7696272 | 70.0000000 | SiO2 |
| 8 | 478.3542999 | 1.0501401 | |
| 9 | 156.8162573 | 32.0000000 | SiO2 |
| 10 | 1393.7788412 | 21.2612233 | |
| 11 | 192.1121934 | 18.0444824 | SiO2 |
| 12 | −438.3249056 | 39.1767434 | |
| 13 | −138.2494573 | 29.9439056 | SiO2 |
| 14 | −140.1019510 | 142.3979298 | |
| 15 | −938.6711014 | 69.9562812 | SiO2 |
| 16 | −222.6687143 | 3.0245296 | |
| 17 | 463.3315128 | 40.0365122 | SiO2 |
| 18 | −777.6311667 | 1.0116204 | |
| 19 | 362.0391409 | 37.2448976 | SiO2 |
| 20 | −37671.4024308 | 222.4391984 | |
| 21 | −453.8375624 | −209.4391984 | M1 |
| 22 | 476.7781569 | 219.4569127 | M2 |
| 23 | −1022.1703573 | 44.8350797 | SiO2 |
| 24 | −237.7955226 | 273.9004540 | |
| 25 | −259.7245737 | −263.9004540 | M3 |
| 26 | 206.4183059 | 299.1795411 | M4 |
| 27 | 531.5627998 | 69.6383962 | SiO2 |
| 28 | −358.1011976 | 3.4259601 | |
| 29 | −6427.5751908 | 17.0000000 | SiO2 |
| 30 | 268.4601365 | 17.2904013 | |
| 31 | 312.5973369 | 18.0606591 | SiO2 |
| 32 | 187.0263267 | 39.6738534 | |
| 33 | 5038.9118596 | 15.0000000 | SiO2 |
| 34 | 152.8093480 | 32.8994944 | |
| 35 | −1266.5272600 | 12.3823008 | SiO2 |
| 36 | 488.7373353 | 11.1724733 | |
| 37 | 909.4485395 | 37.5357563 | SiO2 |
| 38 | −227.2091212 | 2.6479219 | |
| 39 | 527.0198013 | 15.0000000 | SiO2 |
| 40 | 306.0585752 | 6.8212138 | |
| 41 | 314.0733250 | 59.1304401 | SiO2 |
| 42 | −226.0076721 | 42.8127131 | |
| 43 | 710.2369898 | 34.9812838 | SiO2 |
| 44 | −1416.9817454 | 10.1954248 | |
| 45 | 0.0000000 | 7.7985891 | APERTURE STOP |
| 46 | 540.0836513 | 42.9773866 | SiO2 |
| 47 | −333.3831433 | 1.0000000 | |
| 48 | 185.3993099 | 36.9846580 | SiO2 |
| 49 | 5111.3633056 | 1.0000000 | |
| 50 | 78.2204149 | 38.5238348 | SiO2 |
| 51 | 172.7090792 | 1.0000000 | |
| 52 | 80.1840287 | 37.7684555 | SiO2 |

TABLE 1-continued

| 53 | 0.0000000 | 3.0000000 | water |
|----|-----------|-----------|-------|

ASPHERICAL SURFACES

| i | K | A | B | C |
|---|---|---|---|---|
| 2 | 0.000000000E+00 | 2.743279237E−08 | −2.561548992E−12 | 4.057477328E−16 |
| 4 | 0.000000000E+00 | 8.542855382E−08 | −4.975130714E−13 | −4.396302387E−16 |
| 10 | 0.000000000E+00 | 2.033530736E−07 | 1.613633677E−11 | 3.268722913E−15 |
| 14 | 0.000000000E+00 | 1.697427590E−07 | 1.414729954E−11 | 3.313900526E−16 |
| 17 | 0.000000000E+00 | −1.273273699E−08 | 3.027133520E−14 | −1.243731666E−18 |
| 21 | −1.739865281E+00 | 0.000000000E+00 | 0.000000000E+00 | 0.000000000E+00 |
| 22 | −7.426191350E−01 | 0.000000000E+00 | 0.000000000E+00 | 0.000000000E+00 |
| 25 | −1.024203773E+00 | 0.000000000E+00 | 0.000000000E+00 | 0.000000000E+00 |
| 26 | −2.766891029E−01 | 0.000000000E+00 | 0.000000000E+00 | 0.000000000E+00 |
| 30 | 0.000000000E+00 | −9.265706413E−08 | 3.934883237E−14 | 1.276084365E−16 |
| 36 | 0.000000000E+00 | 4.998220056E−08 | 2.060774687E−12 | −1.236324844E−16 |
| 39 | 0.000000000E+00 | −3.641346936E−08 | 4.175653948E−13 | 1.177765081E−16 |
| 41 | 0.000000000E+00 | −1.579864231E−08 | 6.647833797E−14 | −9.204616587E−17 |
| 46 | 0.000000000E+00 | −1.492042078E−08 | −2.459155479E−13 | 3.053759186E−17 |
| 49 | 0.000000000E+00 | −2.948058480E−08 | 2.359358241E−12 | 3.477179154E−17 |

| i | D | E | F |
|---|---|---|---|
| 2 | −2.619985635E−20 | −7.900113869E−25 | 1.528081981E−28 |
| 4 | 5.861895427E−20 | −2.756432806E−24 | 2.858185997E−29 |
| 10 | 9.086622713E−19 | 3.192939002E−22 | 1.512726363E−35 |
| 14 | 1.424577429E−21 | −1.478303136E−23 | 8.998041506E−28 |
| 17 | 2.139905850E−23 | −4.626930115E−28 | 2.782423860E−33 |
| 21 | 0.000000000E+00 | 0.000000000E+00 | 0.000000000E+00 |
| 22 | 0.000000000E+00 | 0.000000000E+00 | 0.000000000E+00 |
| 25 | 0.000000000E+00 | 0.000000000E+00 | 0.000000000E+00 |
| 26 | 0.000000000E+00 | 0.000000000E+00 | 0.000000000E+00 |
| 30 | −4.362059294E−21 | −2.109484850E−26 | 2.506144246E−30 |
| 36 | −8.906367731E−21 | −4.493867152E−27 | 3.480859037E−30 |
| 39 | −6.426950097E−21 | 2.335012361E−25 | −7.505504699E−30 |
| 41 | 6.026119784E−21 | −2.070183484E−25 | 2.697744680E−30 |
| 46 | 1.745588488E−21 | −1.222471798E−25 | 1.838428599E−30 |
| 49 | −6.856869698E−21 | 3.657616486E−25 | −5.439585866E−30 |

Figure 14A:
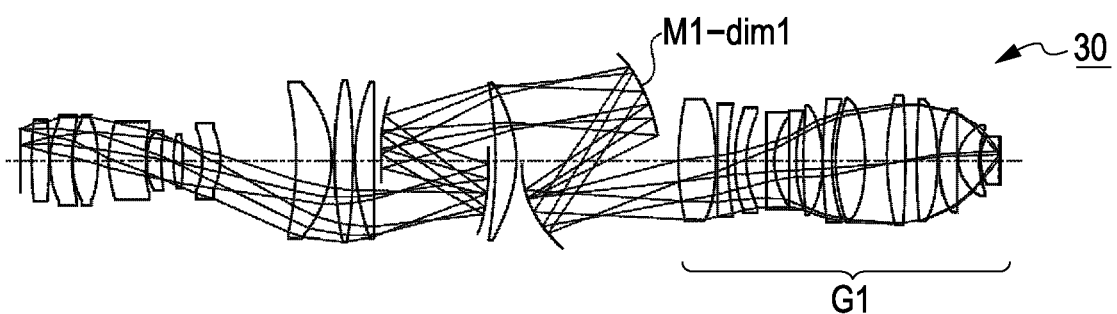
FIG. 14A shows a projection optical system.
Figure 14B:
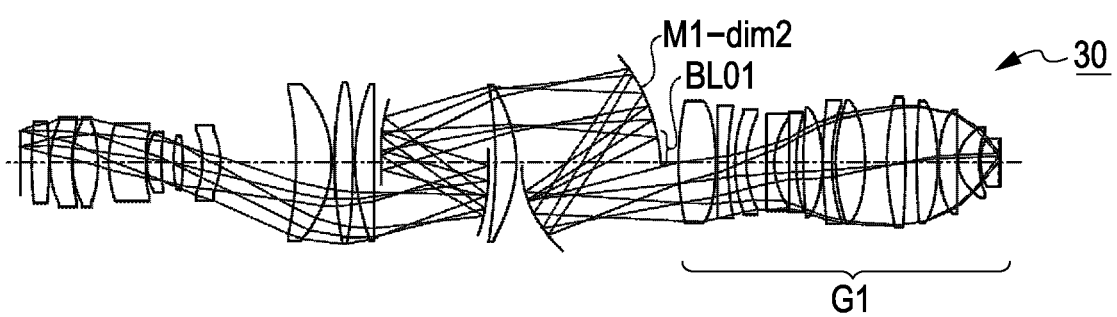
FIG. 14B shows another projection optical system.
Figure 15A:
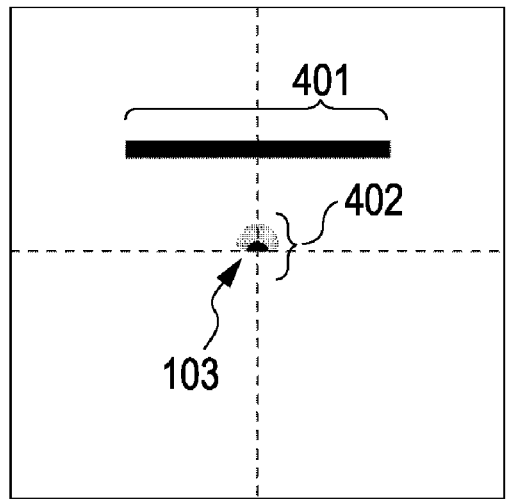
FIG. 15A shows light distribution at a second object.
Figure 15B:
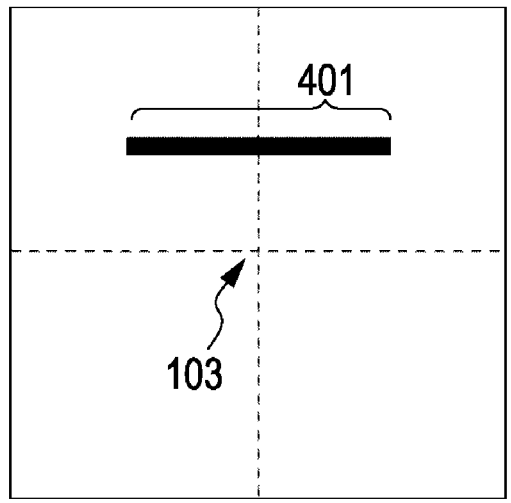
FIG. 15B shows light distribution at a second object.
Figure 15C:
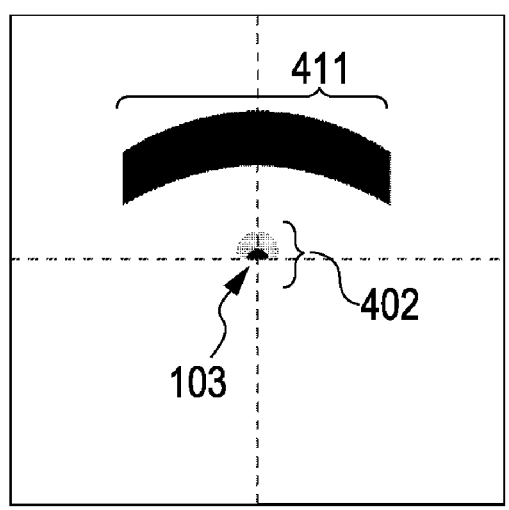
FIG. 15C shows light distribution at a second object.
Figure 15D:
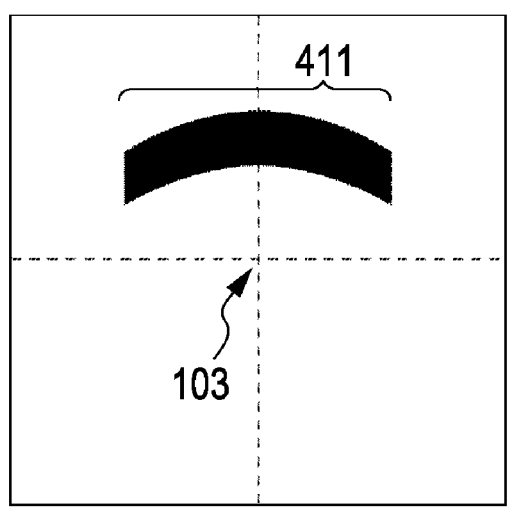
FIG. 15D shows light distribution at a second object.

Next, an example to which at least one exemplary embodiment of the present invention is applied to the projection optical system shown in FIG. 11A will be described. FIG. 14A shows a light path when an illumination area (measuring 104 mm×7.5 mm) in an object plane is irradiated with light. M1-dim1 denotes a reflecting portion and an outer peripheral portion of a reflecting mirror M1. FIG. 15A shows a distribution of light illuminating an image plane, when the illumination area in the object plane is illuminated with light in the projection optical system shown in FIG. 14A. In FIG. 15A, reference numeral 401 denotes the illumination area subjected to projection, and reference numeral 402 denotes the flare (A). A projection optical system 30 shown in FIG. 14B corresponds to a projection optical system in which at least one exemplary embodiment of the present invention is applied to the projection optical system shown in FIG. 14A. FIG. 14B shows a light-shielding member BL01 that is provided at M1-dim2 representing the reflecting portion and the outer peripheral portion of the reflecting mirror M1 in the projection optical system shown in FIG. 14A. FIG. 15B shows a distribution of light illuminating an image plane when an illumination area in an object plane is illuminated with light in the projection optical system shown in FIG. 14B. As can be understood by comparing FIGS. 15B and 15A, the application of at least one exemplary embodiment of the present invention makes it possible to prevent the flare (A) from reaching the image plane. When an arc-shaped slit illumination area is used in the projection optical system shown in FIG. 14A while maintaining a minimum distance β and a maximum distance γ between the optical axis and the illumination area in the object plane, it is possible for the illumination area to have a short-side length of 20 mm. FIG. 15C shows a distribution of light illuminating the image plane, when the arc-shaped slit illumination area in the object plane is illuminated with light. In FIG. 15C, reference numeral 411 denotes the illumination area subjected to projection, and reference numeral 402 denotes the flare (A). FIG. 15D shows distribution of light in a projection optical system 30 to which at least one exemplary embodiment of the present invention is applied. As can be understood by comparing FIGS. 15D and 15C, the application of at least one exemplary embodiment of the present invention prevents the flare (A) from reaching the image plane. This means that the illumination area can be widened by forming it into an arc shape while preventing projection light, used to project a pattern, from being interfered by a light-shielding member and while maintaining a maximum distance γ and a minimum distance β between the illumination area and the optical axis. Although, in this example, the illumination area is arc-shaped, it can be any other shape.

Although the exemplary embodiment is described using an immersion projection optical system in which a portion between a final lens of the projection optical system and the image plane is filled with a liquid, the present can be applied to projection optical systems other than an immersion projection optical system. The portion between the final lens and the image plane can be a vacuum, or filled with a gas, a liquid, or a solid.

According to the above-described exemplary embodiment(s) of the present invention, providing a light-shielding member makes it possible to reduce the amount of flare (A) or flare (B) reaching the second object, so that a catadioptric projection optical system and a dioptric projection optical system having excellent resolution can be provided.

Second Exemplary Embodiment

An exemplary embodiment of an exposure apparatus including any one of the above-described projection optical systems 30 will be described with reference to FIG. 16. FIG. 16 is a schematic view of a structure of an exposure apparatus 1 according to the exemplary embodiment.

The exposure apparatus 1 is an immersion exposure apparatus that is used to project a circuit pattern, formed on a reticle (mask) 101, serving as a first object, onto a wafer 102, serving as a second object, by exposure using a step-and-scan method through a liquid LW supplied between the projection optical system 30 and the wafer 102.

As shown in FIG. 16, the exposure apparatus 1 includes an illumination device 10, a reticle stage 25 on which the reticle 101 is placed, the projection optical system 30, a wafer stage 45 on which the wafer 102 is placed, a distance-measuring device 50, a stage controller 60, and other components including a liquid supplier 70, an immersion controller 80, a liquid recovering device 90, and a nozzle unit 100.

The illumination device 10 illuminates the reticle 101 having the circuit pattern formed thereon, and includes a light source 12 and an illumination optical system 14. In the exemplary embodiment, the light source 12 is an ArF excimer laser having a wavelength of approximately 193 nm.

The illumination optical system 14 illuminates a slit illumination area of the reticle 101 with light from the light source 12.

The reticle 101 is conveyed from outside the exposure apparatus 1 by a reticle conveying system and is supported and driven by the reticle stage 25.

The reticle stage 25 supports the reticle 101 through a reticle chuck, and driving of the reticle stage 25 is controlled by the stage controller 60.

The wafer 102 is supported and driven by the wafer stage 45. In accordance with the slit illumination area subjected to projection by the projection optical system 30, an exposure area on the wafer 102 is scanned to perform exposure on the wafer 102 using the reticle 101. The wafer 102 is a substrate, which can be a liquid crystal substrate or a wide variety of other substrates. Photoresist is applied to the wafer 102. A liquid holder 44 is a plate that sets a surface of the wafer 102 supported by the wafer stage 45 and an area around the wafer 102 in substantially the same plane, and holds the liquid LW. The liquid holder 44 is disposed around the wafer 102, and has a surface that is at the same height as the surface of the wafer 102. In addition, setting the liquid holder 44 at substantially the same height as the surface of the wafer 102 allows it to hold the liquid LW even in an area outside the wafer 102 when exposing a shot near the outer periphery of the wafer 102.

The distance measuring device 50 measures a position of the reticle stage 25 and a two-dimensional position of the wafer stage 45 in real time through reference mirrors 52 and 54 and laser interferometers 56 and 58. A result of the distance measurement performed by the distance measuring device 50 is transmitted to the stage controller 60. To control positioning and synchronization on the basis of the distance measurement result, the stage controller 60 drives the reticle stage 25 and the wafer stage 45 at a certain speed ratio.

The stage controller 60 controls the driving of the reticle stage 25 and the wafer stage 45. The liquid supplier 70 is capable of supplying the liquid LW to a space or a gap between the wafer 102 and the final lens of the projection optical system 30, and has a liquid supply pipe 72. In addition, the liquid supplier 70 supplies the liquid LW through the liquid supply pipe 72, disposed near the final lens of the projection optical system 30, and forms a film of the liquid LW in the space between the projection optical system 30 and the wafer 102. In the exemplary embodiment, pure water is used as the liquid LW.

The liquid supply pipe 72 supplies the liquid LW to the space between the projection optical system 30 and the wafer 102 through a liquid supply port formed in the nozzle unit 100.

The immersion controller 80 obtains from the stage controller 60 information regarding, for example, the current position, the speed, the acceleration, the target position, and the direction of movement of the wafer stage 45, and controls immersion exposure on the basis of the obtained information.

The liquid recovering device 90 is capable of recovering the liquid LW supplied by the liquid supplier 70, and includes a liquid recovery pipe 92. The liquid recovery pipe 92 recovers the supplied liquid LW through a liquid recovery port formed in the nozzle unit 100.

The liquid supply port and the liquid recovery port are formed in a wafer 102 side of the nozzle unit 100. The liquid supply port is used to supply the liquid LW, and is connected to the liquid supply pipe 72. The liquid recovery port is used to recover the supplied liquid LW, and is connected to the liquid recovery pipe 92.

The above-described exposure apparatus provides higher performance than a related exposure apparatus.

Third Exemplary Embodiment

Figure 17:
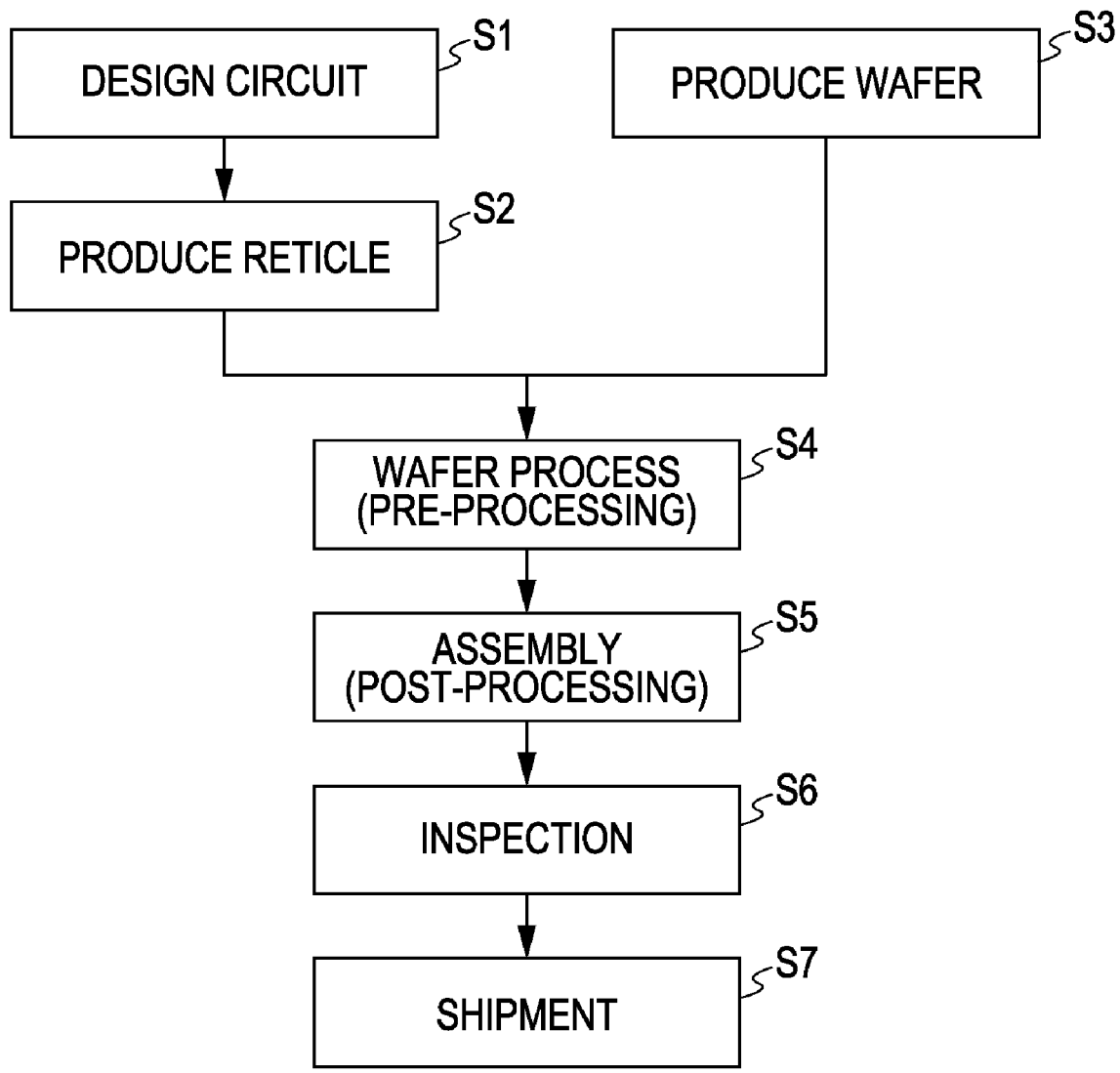
FIG. 17 is a flowchart illustrating a device manufacturing method.

An exemplary embodiment of a device manufacturing method using the above-described exposure apparatus 1 will be described with reference to FIGS. 17 and 18. FIG. 17 is a flowchart illustrating the device manufacturing method. Here, the manufacturing method of a semiconductor device will be described. In Step S1, a pattern of the device is designed. Then, in Step S2, a reticle having the designed circuit pattern formed thereon is produced. In Step S3, a wafer is produced using a material such as silicon. In Step 4 (a wafer process step or a pre-processing step), the reticle and the wafer are used to form an actual circuit on the wafer by lithography techniques. In Step S5 (an assembly step or a post-processing step), the wafer having the circuit formed thereon in Step S4 is formed into a semiconductor chip, wherein assembly (dicing and bonding), packaging of the chip, etc., are performed. In Step S6, the semiconductor device prepared in Step S5 is inspected by conducting, for example, operation confirmation and durability tests. Thereafter, in Step S7, the completed semiconductor device is shipped.

Figure 18:
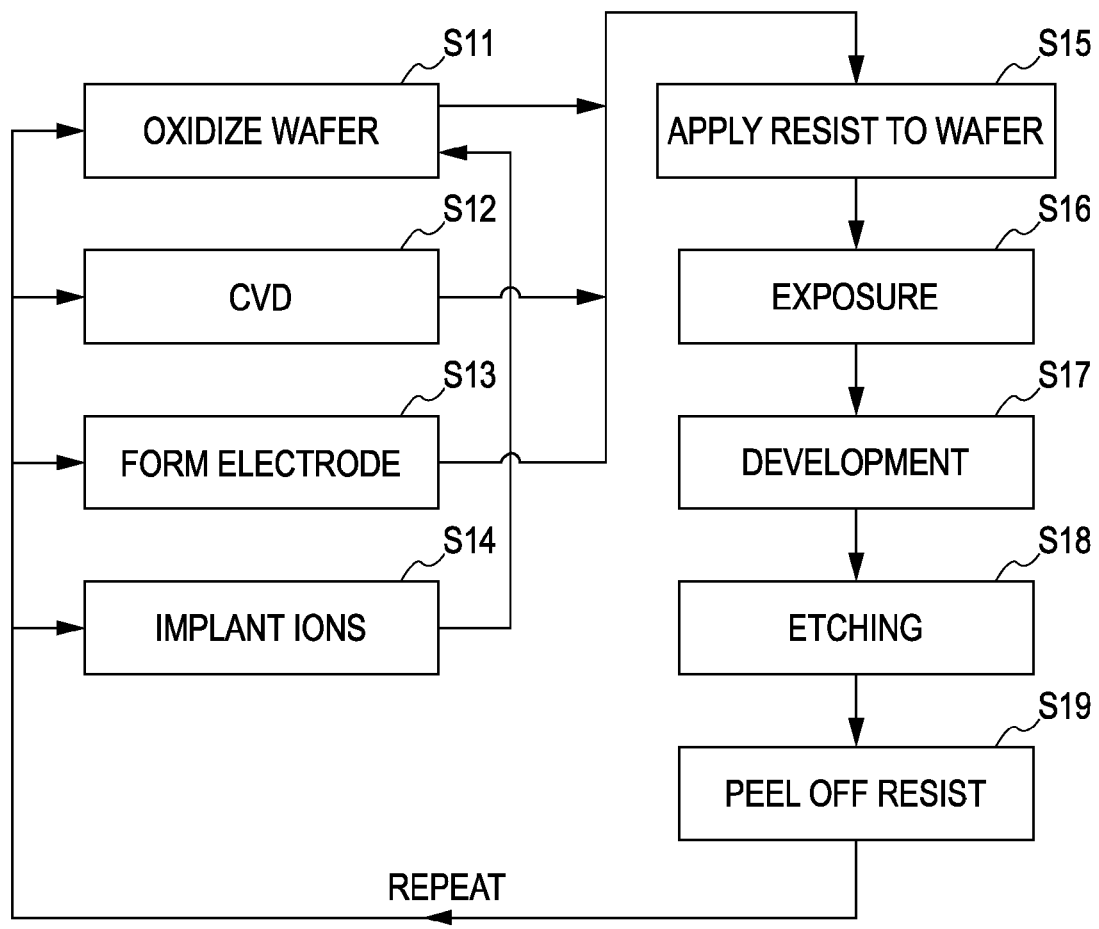
FIG. 18 is a detailed flowchart illustrating a wafer process shown in FIG. 17.

FIG. 18 is a detailed flowchart illustrating the wafer process of Step S4. In Step S11, a surface of the wafer is oxidized. Then, in Step S12 (chemical-vapor deposition (CVD) step), an insulation film is formed on the surface of the wafer. In Step S13, an electrode is formed on the wafer by, for example, evaporation. In Step S14, ions are implanted into the wafer. In Step S15 (resist application step), a photosensitization agent is applied to the wafer. In Step S16, the reticle circuit pattern is projected onto the wafer by exposure using the exposure apparatus 1. In Step S17, the exposed wafer is developed. In Step S18, portions other than where a developed resist image is formed are etched. In Step S19, any unnecessary resist is removed from the wafer after the etching is performed. Multiple circuit patterns are formed on the wafer by repeating the above-described steps. According to the device manufacturing method, it is possible to produce a device (such as a semiconductor device or a liquid crystal device) having a higher quality than a related device.

While the present invention has been described with reference to exemplary embodiments, it is to be understood that the invention is not limited to the disclosed exemplary embodiments. Various modifications and changes can be made within the scope of the gist of the present invention.

The entire disclosure of Japanese Patent Application No. 2006-171505 filed on Jun. 21, 2006 including claims, specification, drawings, and abstract are incorporated herein by reference in its entirety.

What is claimed:

1. A projection optical system that projects an image of a pattern of a first object onto a second object, the projection optical system comprising:
   a first image forming optical system that forms an intermediate image of the pattern, the first image forming optical system including a concave mirror and a reflecting mirror, the concave mirror having a reflecting surface that opposes the second object, the reflecting mirror directing light from the first object to the concave mirror;
   a second image forming optical system that forms an image of the intermediate image onto the second object, the second image forming optical system including a lens; and
   a light-shielding member disposed between the concave mirror and the lens,
   wherein an optical axis of the projection optical system does not pass through an area of the reflecting surface of the reflecting mirror where the light from the first object is reflected, and passes through the light-shielding member, and
   wherein a pupil plane of the projection optical system is free of a void area.

2. The projection optical system according to claim 1, wherein the light-shielding member is joined to the reflecting mirror.

3. The projection optical system according to claim 2, wherein the light-shielding member is a portion of the reflecting mirror.

4. The projection optical system according to claim 1, wherein the light-shielding member is disposed between the reflecting mirror and the lens.

5. The projection optical system according to claim 1, wherein at least a portion of the light-shielding member is disposed in an area that is closer to the optical axis than the light reflected by the concave mirror.

6. The projection optical system according to claim 1, wherein at least a portion of the light-shielding member is disposed between the area of the reflecting mirror and the light reflected by the concave mirror.

7. The projection optical system according to claim 1, wherein at least a portion of the light-shielding member is disposed in an area that satisfies the following expression so as to have a radius R with the optical axis of the projection optical system as a center:

$$R = D \times \tan(\arcsin|NA \times \beta/n|)$$

where NA denotes a numerical aperture at the second object side of the projection optical system, $\beta$ denotes imaging magnification of the second image forming optical system from the first object side to the second object side, n denotes a refractive index of a material with respect to the light, a space where the intermediate image exists being filled with the material, and D denotes a distance between the light-shielding member and a paraxial image forming position of the first image forming optical system on the optical axis.

8. The projection optical system according to claim 1, wherein a boundary at the optical axis side of an illumination area of the first object includes a curve or a plurality of line segments.

9. A projection optical system that projects an image of a pattern of a first object onto a second object, the projection optical system comprising:
   a first image forming optical system that forms an intermediate image of the pattern, the first image forming optical system including a concave mirror and a reflecting mirror, the concave mirror having a reflecting surface that opposes the second object, the reflecting mirror directing light from the first object to the concave mirror;
   a second image forming optical system that forms an image of the intermediate image onto the second object, the second image forming optical system including a lens; and
   a light-shielding member disposed between the concave mirror and the lens,
   wherein an optical axis of the projection optical system does not pass through an area of the reflecting surface of the reflecting mirror where the light from the first object is reflected,
   wherein the light-shielding member has a portion disposed between the area of the reflecting mirror and the light reflected by the concave mirror,
   wherein the portion of the light-shielding member is disposed in a positive area and a negative area with respect to a first axis corresponding to an $\omega$ axis, where a line extending towards an illumination area of the first object is drawn and a direction of the line having a minimum length between the optical axis of the projection optical system and the illumination area defines the first axis, where a direction perpendicular to the first axis and the optical axis defines a second axis corresponding to a $\xi$ axis, and where the optical axis is an origin, and
   wherein a pupil plane of the projection optical system is free of a void area.

10. An exposure apparatus comprising:
   an illumination optical system that illuminates a reticle with light from a light source; and
   a projection optical system that projects an image of a pattern of the reticle onto a substrate,
   wherein the projection optical system includes:
   (i) a first image forming optical system that forms an intermediate image of the pattern, the first image forming optical system including a concave mirror and a reflecting mirror, the concave mirror having a reflecting surface that opposes a second object, the reflecting mirror directing the light from a first object to the concave mirror;
   (ii) a second image forming optical system that forms an image of the intermediate image onto the second object, the second image forming optical system including a lens; and
   (iii) a light-shielding member disposed between the concave mirror and the lens,
   wherein an optical axis of the projection optical system does not pass through an area of the reflecting surface of the reflecting mirror where the light from the first object is reflected, and passes through the light-shielding member, and
   wherein a pupil plane of the projection optical system is free of a void area.

11. A device manufacturing method comprising the steps of:

exposing a substrate with an exposure apparatus; and developing the exposed substrate, wherein the exposure apparatus includes:
1) an illumination optical system that illuminates a reticle with light from a light source; and
2) a projection optical system that projects an image of a pattern of the reticle onto the substrate, wherein the projection optical system includes:

(i) a first image forming optical system that forms an intermediate image of the pattern, the first image forming optical system including a concave mirror and a reflecting mirror, the concave mirror having a reflecting surface that opposes a second object, the reflecting mirror directing the light from a first object to the concave mirror;

(ii) a second image forming optical system that forms an image of the intermediate image onto the second object, the second image forming optical system including a lens; and (iii) a light-shielding member disposed between the concave mirror and the lens, wherein an optical axis of the projection optical system does not pass through an area of the reflecting surface of the reflecting mirror where the light from the first object is reflected, and passes through the light-shielding member, and wherein a pupil plane of the projection optical system is free of a void area.

* * * * *